US012578381B2

(12) United States Patent
Abe et al.

(10) Patent No.: US 12,578,381 B2
(45) Date of Patent: Mar. 17, 2026

(54) INSPECTION CONNECTOR

(71) Applicant: Murata Manufacturing Co., Ltd.,
Kyoto-fu (JP)

(72) Inventors: Manabu Abe, Nagaokakyo (JP); Ryo Yamaguchi, Nagaokakyo (JP); Kiyoto Araki, Nagaokakyo (JP)

(73) Assignee: Murata Manufacturing Co., Ltd.,
Kyoto-fu (JP)

( * ) Notice: Subject to any disclaimer, the term of this patent is extended or adjusted under 35 U.S.C. 154(b) by 183 days.

(21) Appl. No.: 18/609,500

(22) Filed: Mar. 19, 2024

(65) Prior Publication Data

US 2024/0219457 A1      Jul. 4, 2024

Related U.S. Application Data

(63) Continuation of application No. PCT/JP2022/005226, filed on Feb. 10, 2022.

(30) Foreign Application Priority Data

Sep. 27, 2021      (JP) ................................. 2021-156904

(51) Int. Cl.
*G01R 31/28*          (2006.01)
*H01R 12/71*          (2011.01)
(52) U.S. Cl.
CPC ........ *G01R 31/2884* (2013.01); *H01R 12/716* (2013.01)
(58) Field of Classification Search
CPC .. G01R 31/2884; G01R 1/067; H01R 12/716; H01R 13/6658; H01R 2201/20
(Continued)

(56) References Cited

U.S. PATENT DOCUMENTS

| | | | |
|---|---|---|---|
| 2018/0048100 A1* | 2/2018 | Moilanen | H01R 43/26 |
| 2021/0057835 A1* | 2/2021 | Peng | H05K 3/32 |
| 2022/0294162 A1* | 9/2022 | Narumi | H01R 12/714 |

FOREIGN PATENT DOCUMENTS

| | | |
|---|---|---|
| CN | 109782034 A | 5/2019 |
| JP | 6394310 B2 | 9/2018 |

(Continued)

OTHER PUBLICATIONS

International Search Report issued in PCT/JP2022/005226; mailed Mar. 22, 2022.

*Primary Examiner* — Giovanni Astacio-Oquendo
(74) *Attorney, Agent, or Firm* — Studebaker Brackett PLLC

(57)          ABSTRACT

A cylindrical member has a cylindrical shape having a central axis line extending in an upward-downward direction. A signal terminal holding member is located inside the cylindrical member in a lower portion of the cylindrical member, and is held by the cylindrical member. A first signal terminal is supported by the signal terminal holding member. A circuit substrate is held by the signal terminal holding member. The circuit substrate includes a substrate main body and one or more signal wires. Each of the one or more signal wires includes a first end portion located in an upper portion of the substrate main body and a second end portion located in a lower portion of the substrate main body. Each of the one or more second end portions is electrically connected to any one of the one or more first signal terminals.

20 Claims, 24 Drawing Sheets

(58) Field of Classification Search
USPC ................................... 324/762.01, 537, 500
See application file for complete search history.

(56)                     References Cited

FOREIGN PATENT DOCUMENTS

| WO | 2018/003640 A1 | 1/2018 |
| WO | 2020/049743 A1 | 3/2020 |
| WO | 2020/105525 A1 | 5/2020 |

* cited by examiner

INSPECTION CONNECTOR

CROSS-REFERENCE TO RELATED APPLICATIONS

This application claims benefit of priority to International Patent Application No. PCT/JP2022/005226 filed Feb. 10, 2022, and to Japanese Patent Application No. 2021-156904, filed Sep. 27, 2021, the entire contents of each are incorporated herein by reference.

BACKGROUND

Technical Field

The present disclosure relates to an inspection connector used to measure a high frequency signal.

Background Art

As a disclosure relating to an inspection connector in the related art, for example, a multi-channel probe disclosed in Chinese Patent Application Publication No. 109782034 is known. The multi-channel probe disclosed in Chinese Patent Application Publication No. 109782034 includes a substrate, a plurality of signal terminals, a plurality of connectors, a holder, and a plunger. The plurality of signal terminals extend in an upward-downward direction. The plurality of signal terminals are held by the holder which is an insulating member. The plunger is a cylindrical member connected to a ground potential. The holder is provided inside the plunger. The substrate is provided with a plurality of wires extending in the upward-downward direction. The substrate is held by the holder. In this manner, each of the plurality of wires is electrically connected to any one of the plurality of signal terminals. The plurality of connectors are mounted on the substrate. In this manner, each of the plurality of connectors is connected to any one of the plurality of wires. A coaxial cable is connected to each of the plurality of connectors. The multi-channel probe configured in this way is used to inspect an electronic device.

SUMMARY

Incidentally, in the multi-channel probe disclosed in Chinese Patent Application Publication No. 109782034, it is desirable to easily attach and detach the substrate.

Therefore, the present disclosure provides an inspection connector in which a circuit substrate can be easily attached and detached.

According to an aspect of the present disclosure, there is provided an inspection connector connected to an end portion of one or more coaxial cables including a central conductor, an outer conductor for surrounding a periphery of the central conductor, an insulator for insulating the central conductor and the outer conductor from each other, and a coating for surrounding a periphery of the outer conductor. The inspection connector is used for inspecting an electronic device including a mating connector including one or more second signal terminals.

The inspection connector includes a cylindrical member having a cylindrical shape having a central axis line extending in an upward-downward direction, a signal terminal holding member located inside the cylindrical member in a lower portion of the cylindrical member and held by the cylindrical member, one or more first signal terminals supported by the signal terminal holding member and electrically connected to any one of the one or more second signal terminals, and a circuit substrate held by the signal terminal holding member. The circuit substrate includes a substrate main body and one or more signal wires. The substrate main body has a plate shape having two main surfaces aligned in a forward-rearward direction. Each of the one or more signal wires includes a first end portion located in an upper portion of the substrate main body and a second end portion located in a lower portion of the substrate main body. Each of the one or more first end portions is electrically connected to any one of the one or more central conductors. Each of the one or more second end portions is electrically connected to any one of the one or more first signal terminals. An upper end of the circuit substrate is located above an upper end of the cylindrical member so that a portion of the circuit substrate is visually recognized, when viewed in a direction orthogonal to the upward-downward direction.

According to an aspect of the present disclosure, there is provided an inspection connector connected to an end portion of one or more coaxial cables including a central conductor, an outer conductor for surrounding a periphery of the central conductor, an insulator for insulating the central conductor and the outer conductor from each other, and a coating for surrounding a periphery of the outer conductor. The inspection connector is used for inspecting an electronic device including a mating connector including one or more second signal terminals.

The inspection connector includes a cylindrical member having a cylindrical shape having a central axis line extending in an upward-downward direction, a signal terminal holding member located inside the cylindrical member in a lower portion of the cylindrical member and held by the cylindrical member, one or more first signal terminals supported by the signal terminal holding member and electrically connected to any one of the one or more second signal terminals, and a circuit substrate held by the signal terminal holding member. The circuit substrate includes a substrate main body and one or more signal wires. The substrate main body has a plate shape having two main surfaces aligned in a forward-rearward direction. Each of the one or more signal wires includes a first end portion located in an upper portion of the substrate main body and a second end portion located in a lower portion of the substrate main body. Each of the one or more first end portions is electrically connected to any one of the one or more central conductors. Each of the one or more second end portions is electrically connected to any one of the one or more first signal terminals. A portion of the circuit substrate is hooked on the signal terminal holding member or a portion of the signal terminal holding member is hooked on the circuit substrate so that the circuit substrate is detachably held by the signal terminal holding member.

Hereinafter, definitions of terms in the present specification will be described. In the present specification, an axis or a member extending in a forward-rearward direction does not necessarily indicate only an axis or a member parallel to the forward-rearward direction. The axis or the member extending in the forward-rearward direction is the axis or the member inclined in a range of ±45° with respect to the forward-rearward direction. Similarly, the axis or the member extending in an upward-downward direction is the axis or the member inclined in a range of ±45° with respect to the upward-downward direction. The axis or the member extending in a rightward-leftward direction is the axis or the member inclined in a range of ±45° with respect to the rightward-leftward direction.

Hereinafter, a positional relationship of members in the present specification will be defined. A first member to a third member are structures of an inspection connector. In the present specification, the first member and the second member aligned in the forward-rearward direction indicate the following state. When the first member and the second member are viewed in a direction perpendicular to the forward-rearward direction, both the first member and the second member are in a disposed state on any straight line indicating the forward-rearward direction. In the present specification, the first member and the second member aligned in the forward-rearward direction when viewed in the upward-downward direction indicate the following state. When the first member and the second member are viewed in the upward-downward direction, both the first member and the second member are in a disposed state on any straight line indicating the forward-rearward direction. In this case, when the first member and the second member are viewed in the rightward-leftward direction different from the upward-downward direction, any one of the first member and the second member does not need to be disposed on any straight line indicating the forward-rearward direction. The first member and the second member may be in contact with each other. The first member and the second member may be separated from each other. The third member may exist between the first member and the second member. This definition also applies to directions other than the forward-rearward direction.

In the present specification, a fact that the first member is disposed on the second member refers to the following state. At least a portion of the first member is located directly above the second member. Therefore, the first member overlaps the second member when viewed in the upward-downward direction. This definition applies to directions other than the upward-downward direction.

In the present specification, a fact that the first member is disposed above the second member includes a case where at least a portion of the first member is located directly above the second member and a case where the first member is not located directly above the second member and the first member is located diagonally above the second member. In this case, the first member does not need to overlap the second member when viewed in the upward-downward direction. For example, description of diagonally above refers to an upper left side and an upper right side. This definition applies to directions other than the upward-downward direction.

In the present specification, unless otherwise specified, each portion of the first member will be defined as follows. A front portion of the first member means a front half of the first member. A rear portion of the first member means a rear half of the first member. A left portion of the first member means a left half of the first member. A right portion of the first member means a right half of the first member. An upper portion of the first member means an upper half of the first member. A lower portion of the first member means a lower half of the first member. A front end of the first member means an end of the first member in a forward direction. A rear end of the first member means an end of the first member in a rearward direction. A left end of the first member means an end of the first member in a leftward direction. The right end of the first member means an end of the first member in a rightward direction. An upper end of the first member means an end of the first member in an upward direction. A lower end of the first member means an end of the first member in a downward direction. A front end portion of the first member means a front end of the first member and the vicinity thereof. A rear end portion of the first member means a rear end of the first member and the vicinity thereof. A left end portion of the first member means a left end of the first member and the vicinity thereof. A right end portion of the first member means a right end of the first member and the vicinity thereof. An upper end portion of the first member means an upper end of the first member and the vicinity thereof. A lower end portion of the first member means a lower end of the first member and the vicinity thereof.

When any two members in the present specification are defined as the first member and the second member, a relationship between any two members has the following meaning. In the present specification, a fact that the first member is supported by the second member includes a case where the first member is attached (that is, fixed) to the second member to be immovable with respect to the second member and a case where the first member is attached to the second member to be movable with respect to the second member. In addition, the fact that the first member is supported by the second member includes both a case where the first member is directly attached to the second member and a case where the first member is attached to the second member through the third member.

In the present specification, a fact that the first member is held by the second member includes the case where the first member is attached (that is, fixed) to the second member to be immovable with respect to the second member, and does not include a case where the first member is attached to the second member to be movable with respect to the second member. In addition, the fact that the first member is held by the second member includes both the case where the first member is directly attached to the second member and the case where the first member is attached to the second member through the third member.

In the present specification, description of "the first member and the second member are electrically connected" means that the first member and the second member are electrically conductive therebetween. Therefore, the first member and the second member may be in contact with each other, or the first member and the second member does not need to be in contact with each other. When the first member and the second member are not in contact with each other, the third member having conductivity is disposed between the first member and the second member.

According to the inspection connector according to the present disclosure, the circuit substrate can be easily attached and detached.

BRIEF DESCRIPTION OF THE DRAWINGS

Figure 3:
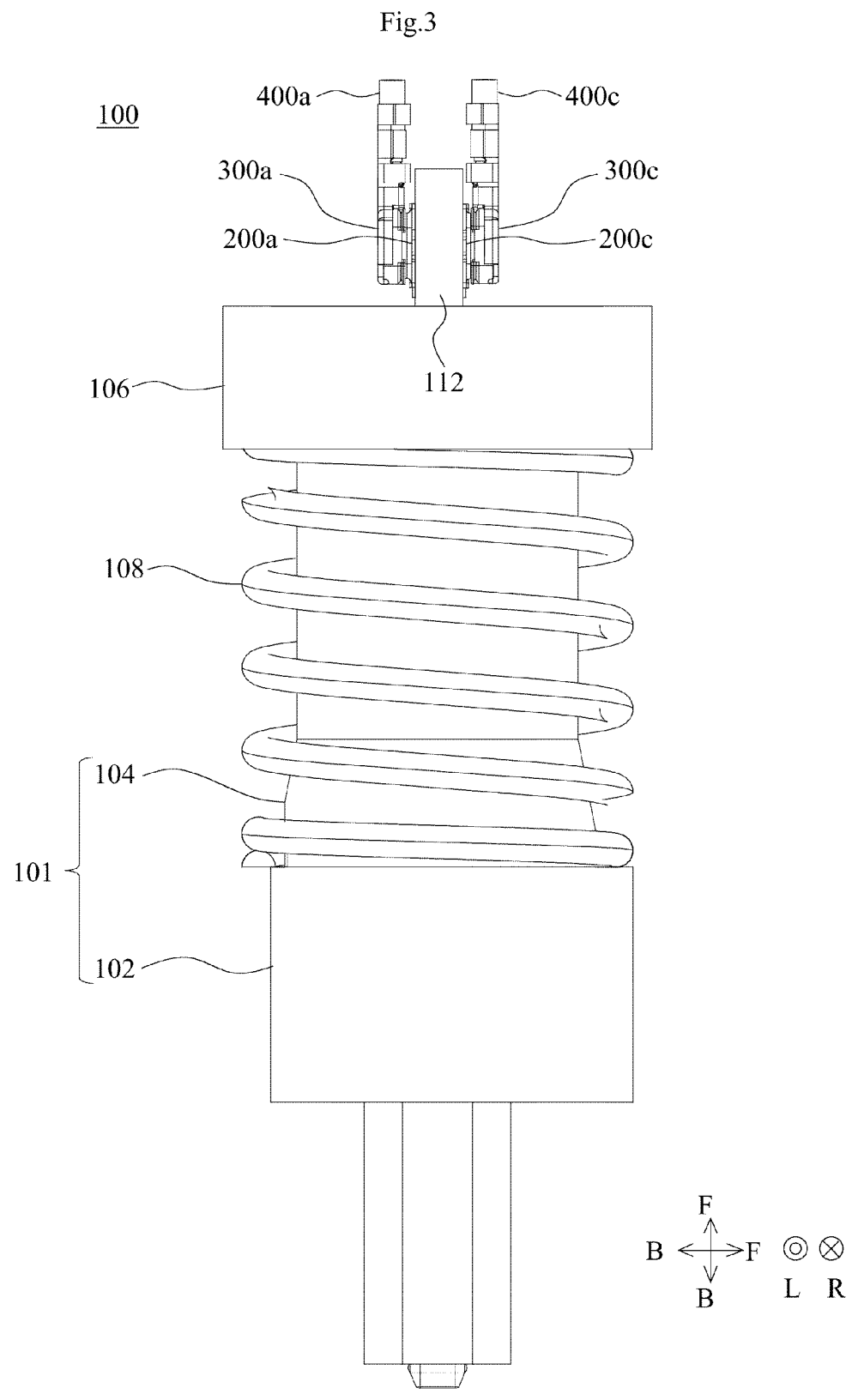

FIG. 3 is a right side view of the inspection connector;

Figure 4:
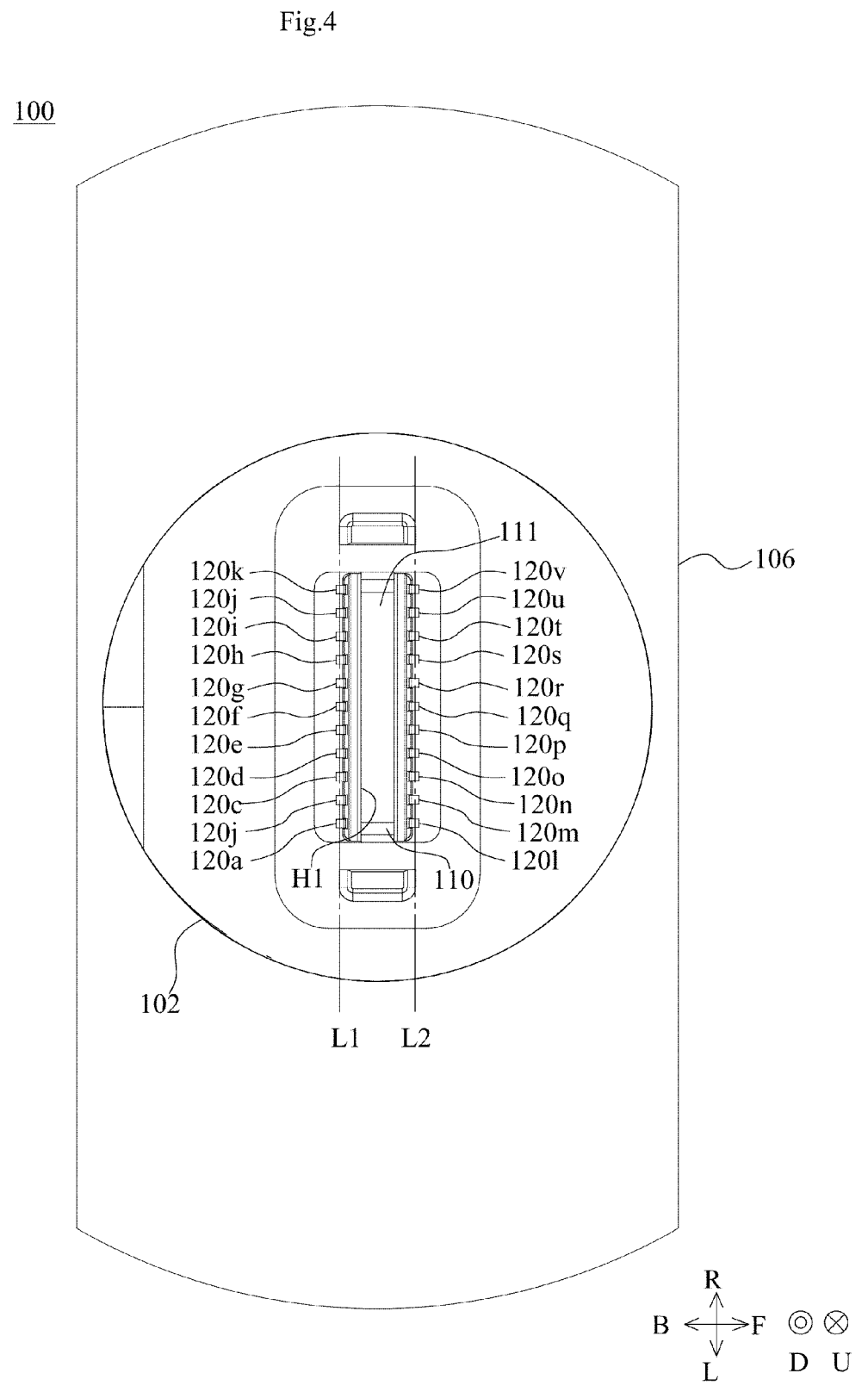

FIG. 4 is a bottom view of the inspection connector;

DETAILED DESCRIPTION

First Embodiment

[Structure of Inspection Connector]

Figure 1:
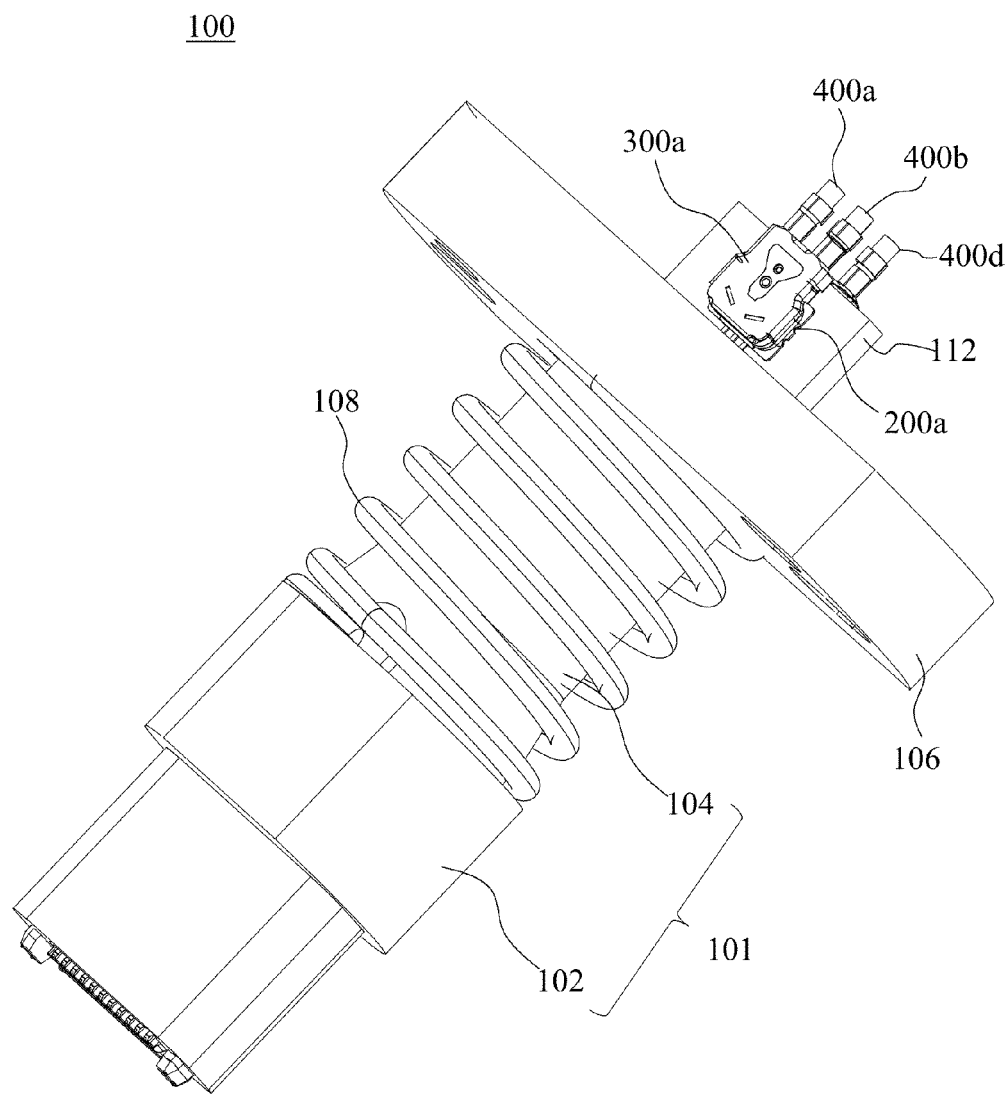
FIG. 1 is a perspective view of an inspection connector.
Figure 1:
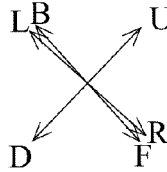
Figure 2:
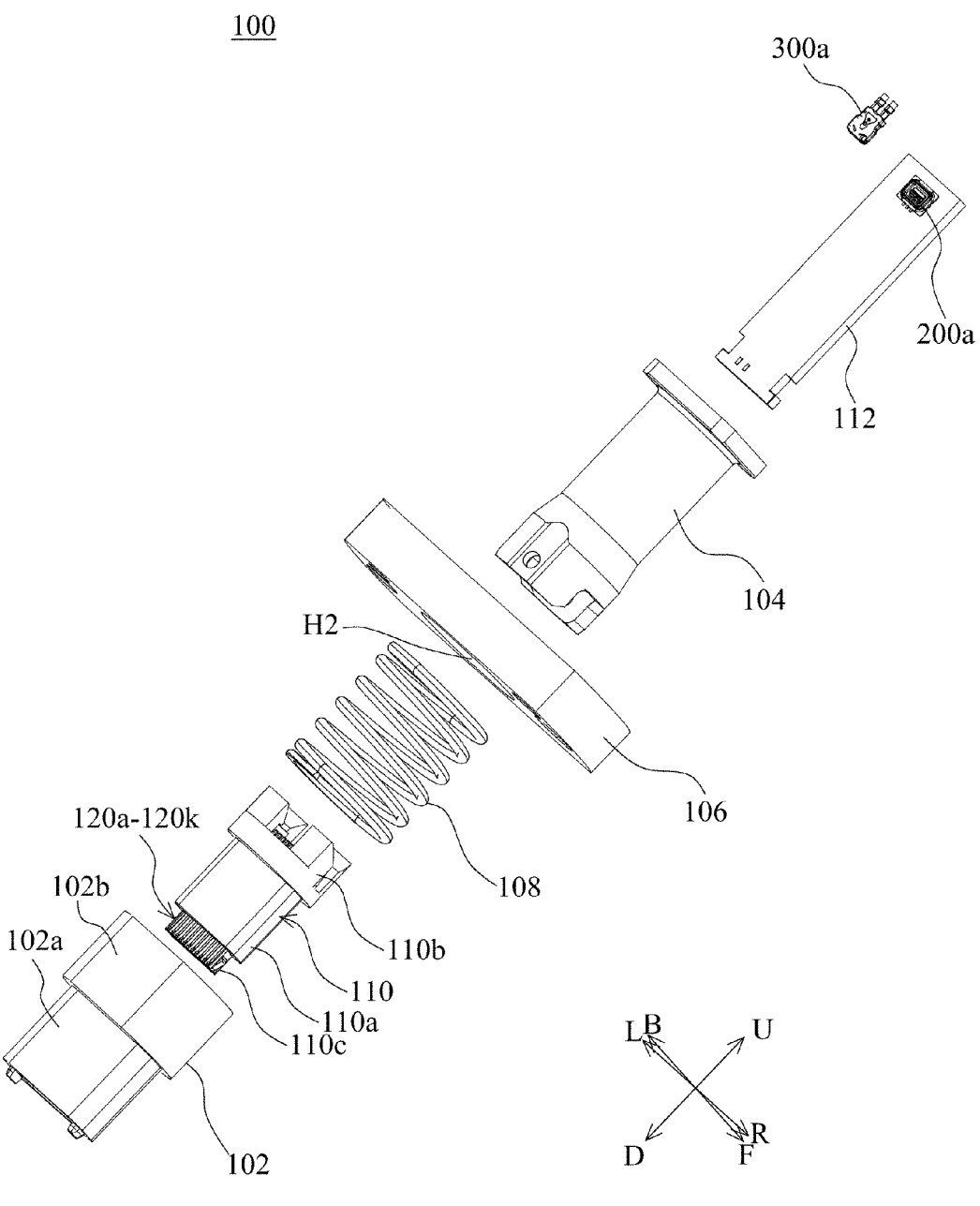
FIG. 2 is an exploded perspective view of the inspection connector.
Figure 5:
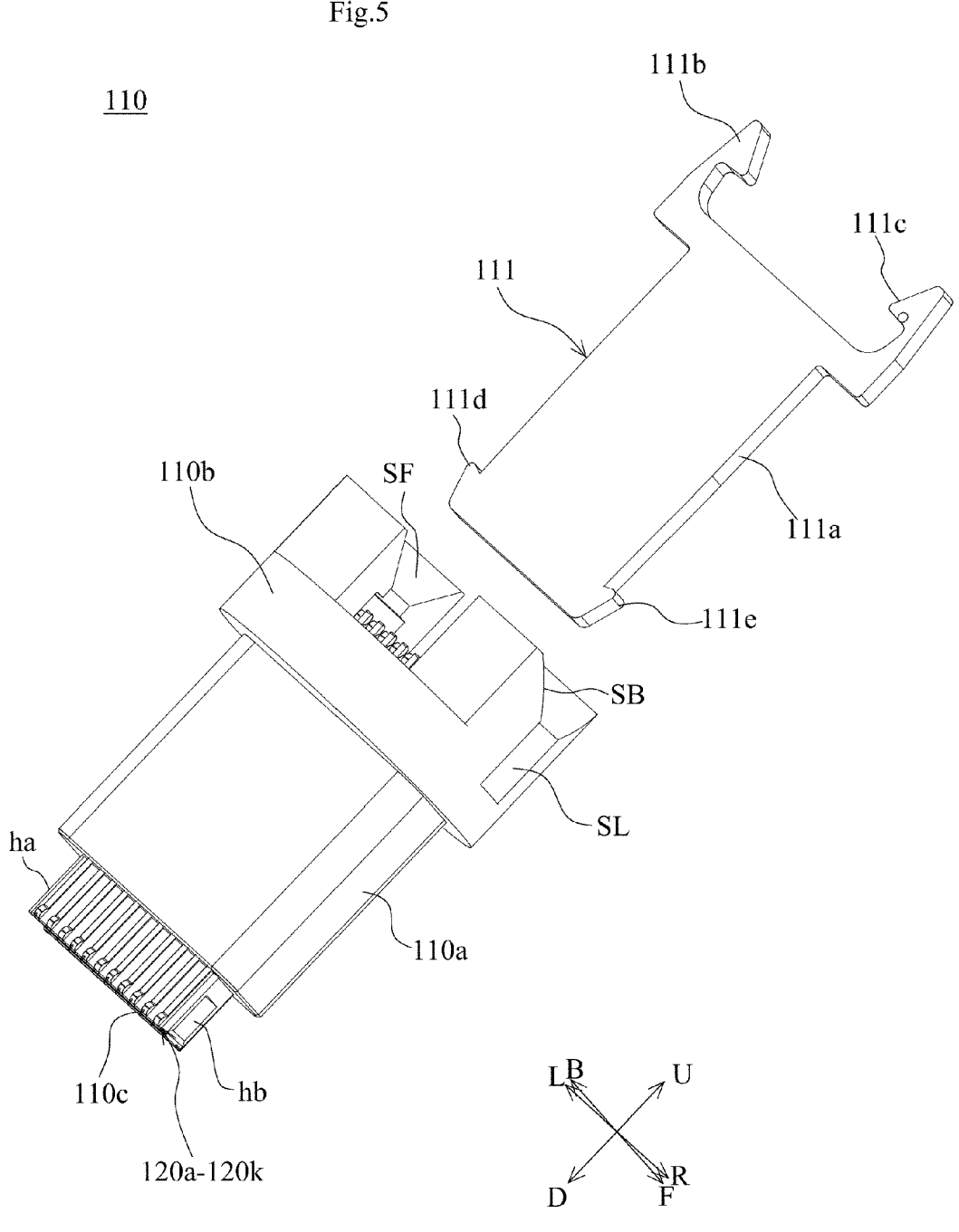
FIG. 5 is a perspective view of a signal terminal holding member.
Figure 6:
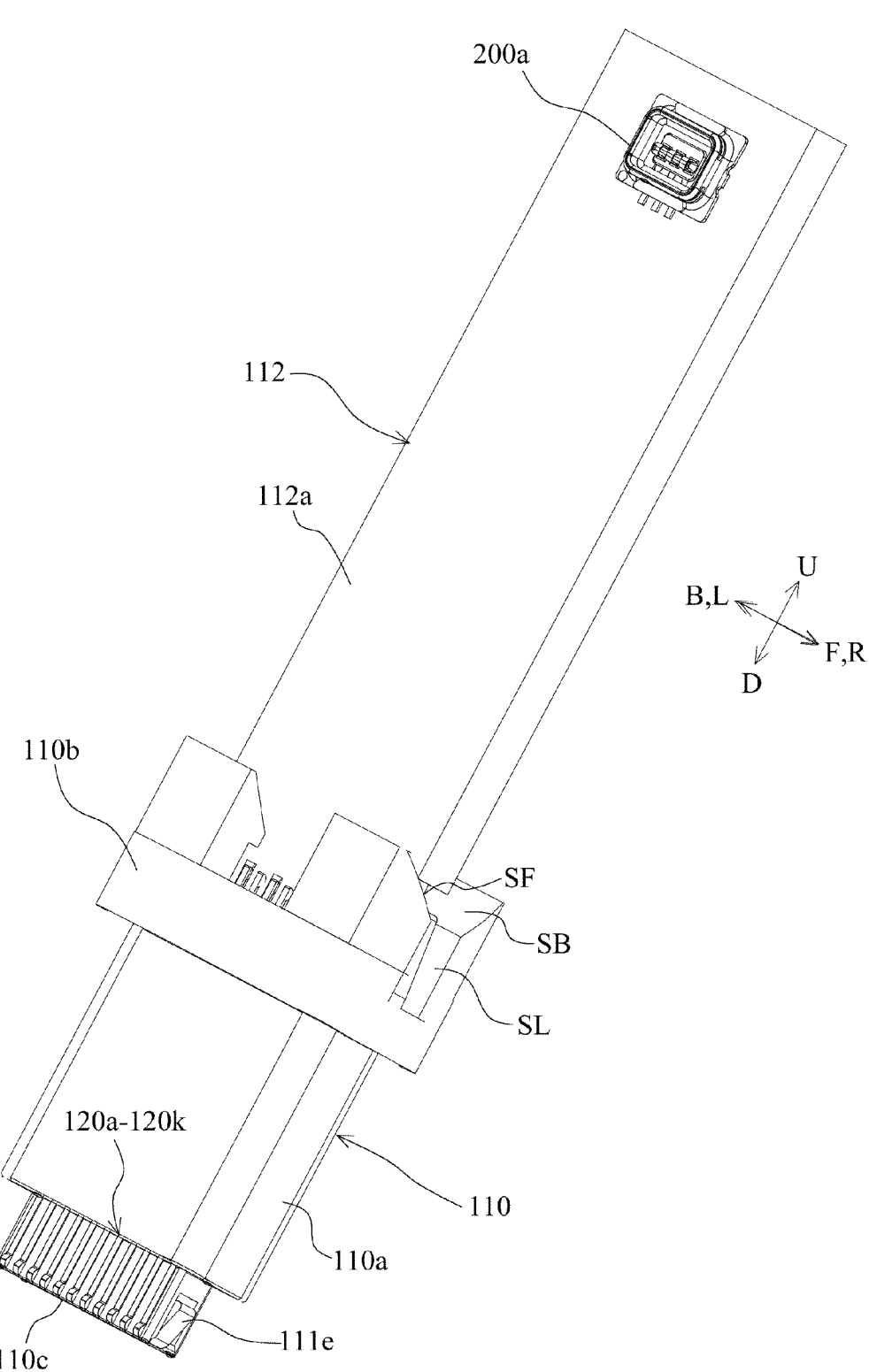
FIG. 6 is a perspective view of the signal terminal holding member and a circuit substrate.
Figure 7:
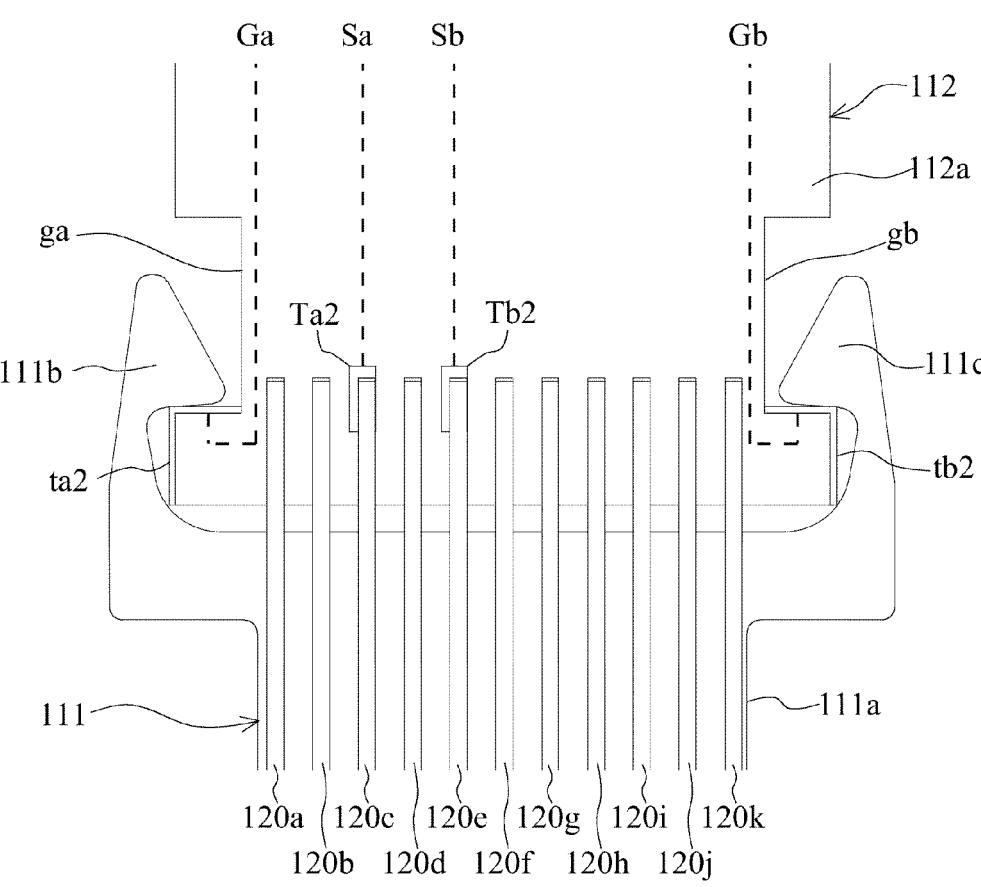
FIG. 7 is a rear view of first signal terminals, the circuit substrate, and a ground member.
Figure 8:
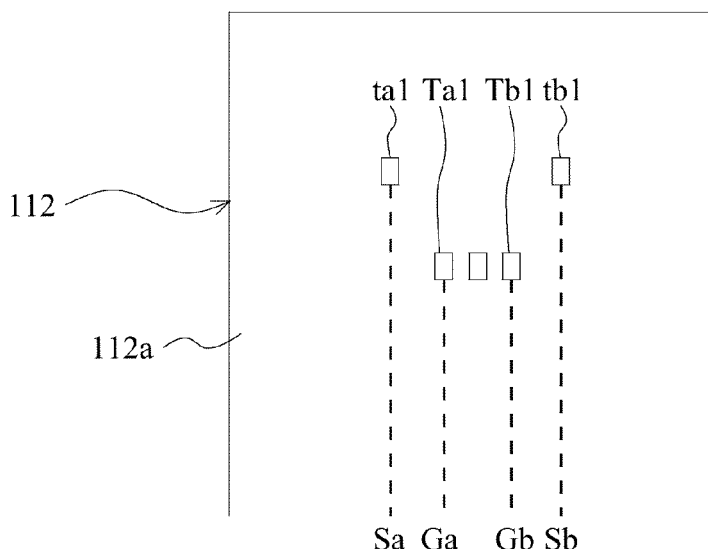
FIG. 8 is a rear view of the circuit substrate.
Figure 9:
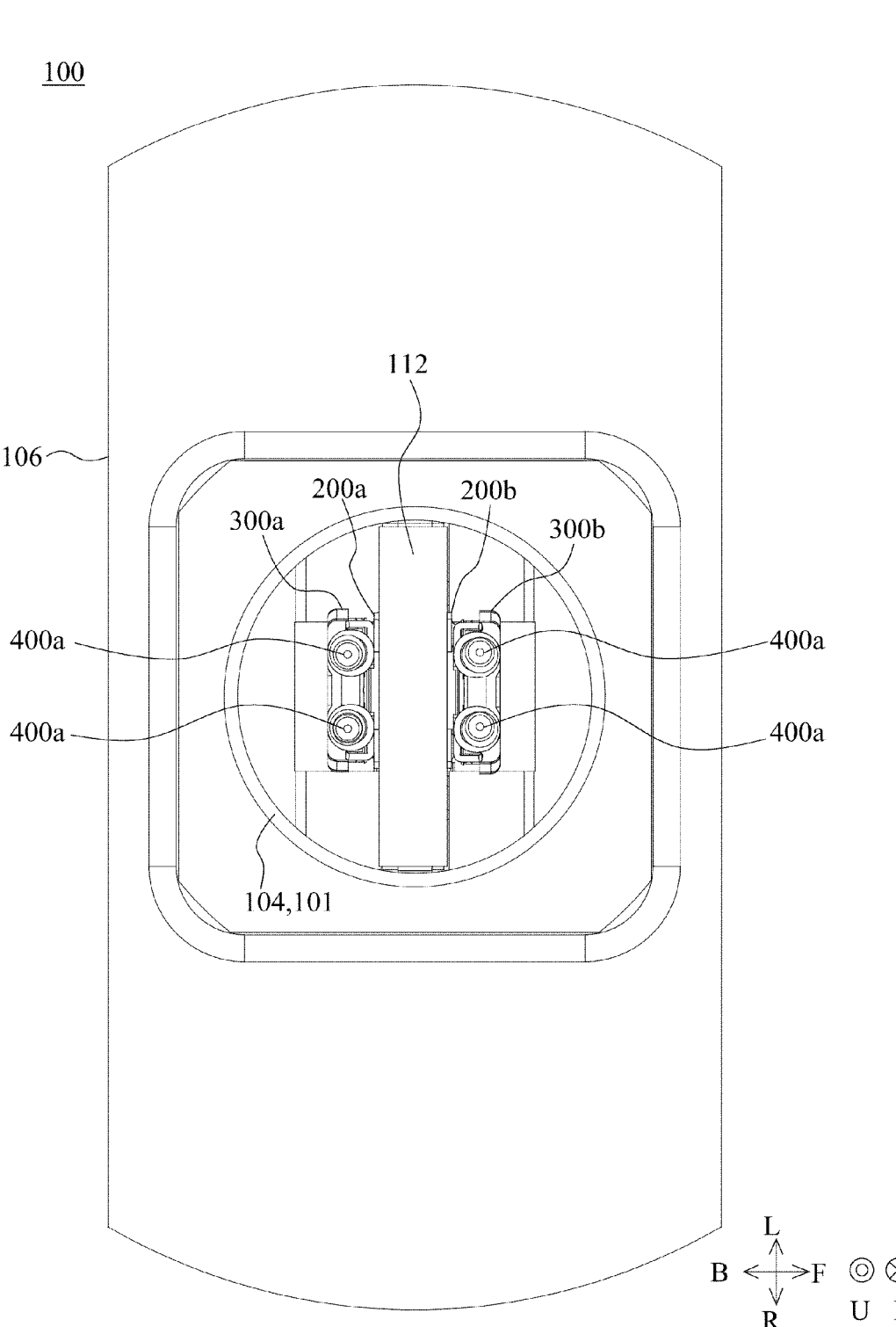
FIG. 9 is a bottom view of the inspection connector.
Figure 10:
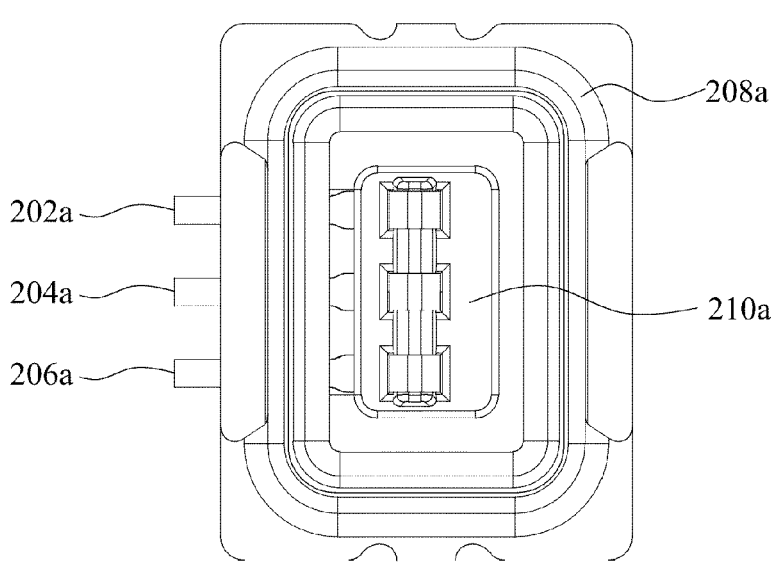
FIG. 10 is a rear view of an external connecting connector.
Figure 11:
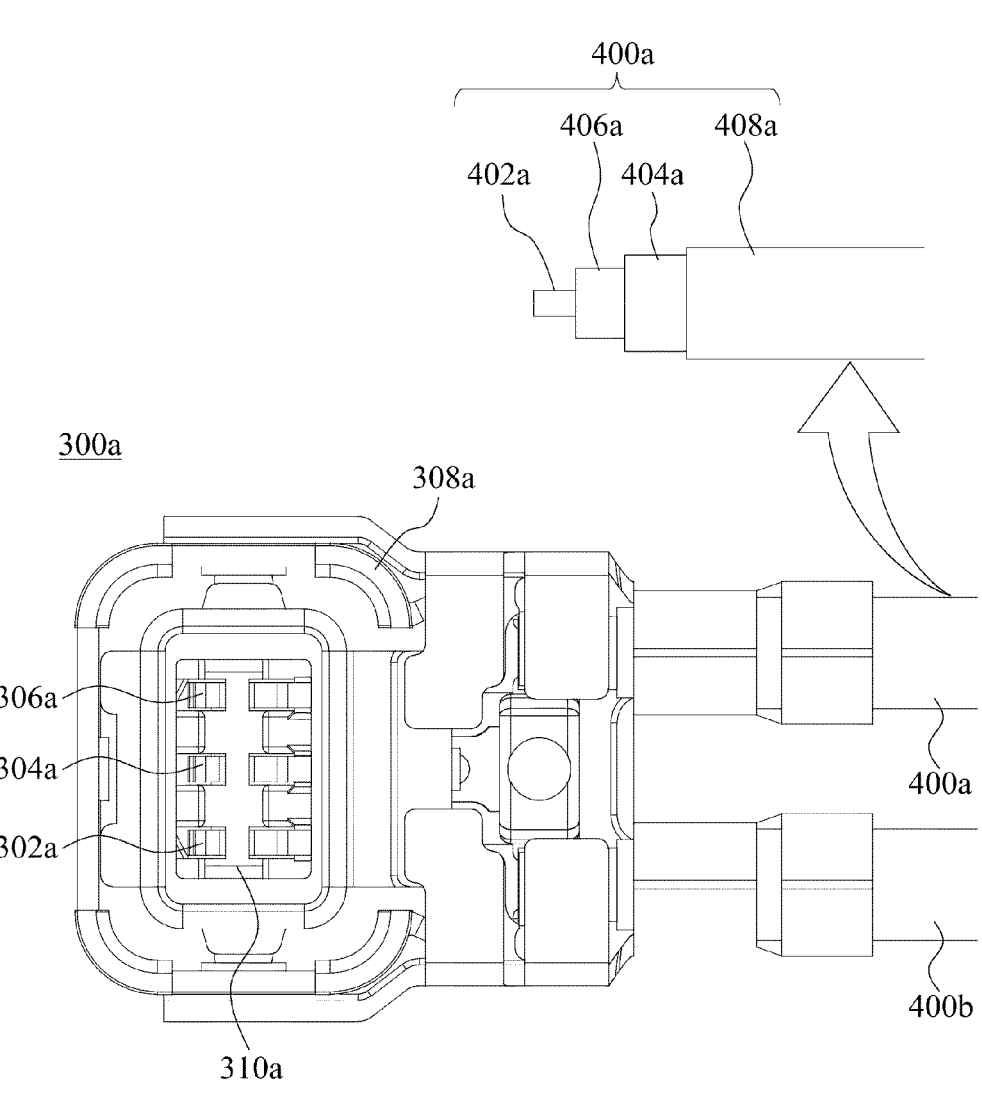
FIG. 11 is a rear view of a connector.

Hereinafter, a structure of an inspection connector 100 according to a first embodiment of the present disclosure will be described with reference to the drawings. FIG. 1 is a perspective view of the inspection connector 100. FIG. 2 is an exploded perspective view of the inspection connector 100. FIG. 3 is a right side view of the inspection connector 100. FIG. 4 is a bottom view of the inspection connector 100. FIG. 5 is a perspective view of a signal terminal holding member 110. FIG. 6 is a perspective view of the signal terminal holding member 110 and a circuit substrate 112. FIG. 7 is a rear view of first signal terminals 120a to 120k, the circuit substrate 112, and a ground member 111. FIG. 8 is a rear view of the circuit substrate 112. FIG. 9 is a bottom view of the inspection connector 100. FIG. 10 is a rear view of an external connecting connector 200a. FIG. 11 is a rear view of a connector 300a.

In the present specification, an extending direction of a central axis of a cylindrical member 101 will be defined as an upward-downward direction. In addition, a direction in which two main surfaces of a substrate main body 112a of the circuit substrate 112 are aligned will be defined as a forward-rearward direction. The forward-rearward direction is orthogonal to the upward-downward direction. A direction orthogonal to the forward-rearward direction and the upward-downward direction will be defined as the rightward-leftward direction. The upward-downward direction, the rightward-leftward direction, and the forward-rearward direction are directions defined for convenience of description. Therefore, the upward-downward direction, the rightward-leftward direction, and the forward-rearward direction do not need to match the upward-downward direction, the rightward-leftward direction, and the forward-rearward direction when the inspection connector 10 is used.

The inspection connector 100 is connected to an end portion of one or more coaxial cables. The inspection connector 100 is used to inspect an electronic device including a mating connector including one or more second signal terminals. The inspection connector 100 is used to measure a high frequency signal transmitted inside the electronic device. As illustrated in FIGS. 1 and 2, the inspection connector 100 includes the cylindrical member 101, a flange 106, a spring 108, a signal terminal holding member 110, the circuit substrate 112, first signal terminals 120a to 120v (refer to FIG. 4), and external connecting connectors 200a and 200b (refer to FIG. 3).

The cylindrical member 101 has a cylindrical shape having a central axis line extending in the upward-downward direction. Specifically, the cylindrical member 101 includes a plunger 102 and a housing 104. As illustrated in FIG. 2, the plunger 102 includes a plunger lower portion 102a and a plunger upper portion 102b. The plunger lower portion 102a has a rectangular parallelepiped shape. The plunger upper portion 102b is located on the plunger lower portion 102a. The plunger upper portion 102b has a columnar shape having the central axis line extending in the upward-downward direction. The plunger 102 is provided with a through-hole penetrating the plunger 102 in the upward-downward direction.

The housing 104 is located on the plunger 102. The housing 104 has a cylindrical shape having the central axis line extending in the upward-downward direction. The housing 104 is provided with a through-hole penetrating the housing 104 in the upward-downward direction. A lower end portion of the housing 104 is inserted into the plunger upper portion 102b. The cylindrical member 101 as described above has conductivity. For example, a material of the cylindrical member 101 is steel use stainless (SUS).

As illustrated in FIG. 5, the signal terminal holding member 110 includes a signal terminal holding member lower portion 110a, a signal terminal holding member upper portion 110b, a signal terminal holding member tip portion 110c, and the ground member 111. The signal terminal holding member lower portion 110a, the signal terminal holding member upper portion 110b, and the signal terminal holding member tip portion 110c are an integrated single member. The signal terminal holding member lower portion 110a has a rectangular parallelepiped shape. The signal terminal holding member upper portion 110b has a columnar shape having the central axis line extending in the upward-downward direction. The signal terminal holding member tip portion 110c has a rectangular parallelepiped shape. The signal terminal holding member upper portion 110b, the signal terminal holding member lower portion 110a, and the signal terminal holding member tip portion 110c are aligned downward from above in this order. However, a size of the signal terminal holding member tip portion 110c in the forward-rearward direction is smaller than a size of the signal terminal holding member lower portion 110a in the forward-rearward direction. The size of the signal terminal holding member tip portion 110c in the rightward-leftward direction is smaller than the size of the signal terminal holding member lower portion 110a in the rightward-leftward direction. The size of the signal terminal holding member lower portion 110a in the forward-rearward direction is smaller than the size of the signal terminal holding member upper portion 110b in the forward-rearward direction. The size of the signal terminal holding member lower portion 110a in the rightward-leftward direction is smaller than the size of the signal terminal holding member upper portion 110b in the rightward-leftward direction.

In addition, the signal terminal holding member lower portion 110a, the signal terminal holding member upper portion 110b, and the signal terminal holding member tip portion 110c are provided with a through-hole H1 penetrating the signal terminal holding member lower portion 110a, the signal terminal holding member upper portion 110b, and the signal terminal holding member tip portion 110c in the upward-downward direction. As illustrated in FIG. 4, the through-hole H1 has an oblong shape when viewed in the upward-downward direction.

As illustrated in FIG. 5, an opening ha is provided on a left surface of the signal terminal holding member tip portion 110c. The opening ha is connected to the through-hole H1. An opening hb is provided on a right surface of the signal terminal holding member tip portion 110c. The opening hb is connected to the through-hole H1.

The signal terminal holding member upper portion 110b is provided with a groove SL open in the upward direction and extending in the rightward-leftward direction. More specifically, the groove SL is provided on an upper surface of the signal terminal holding member upper portion 110b. The groove SL is connected to the through-hole H1.

An inner peripheral surface of the groove SL has a front surface SF and a rear surface SB which face each other. An upper end portion of the front surface SF has a normal line extending in a rearward-upward direction. An upper end portion of the rear surface SB has a normal line extending in a forward-upward direction. Therefore, a distance between the front surface SF and the rear surface SB in the forward-rearward direction increases upward. A material of the signal terminal holding member lower portion 110a, the signal terminal holding member upper portion 110b, and the signal terminal holding member tip portion 110c as described above is a resin having insulating properties. In the present embodiment, the signal terminal holding member lower portion 110a, the signal terminal holding member upper portion 110b, and the signal terminal holding member tip portion 110c are an integrated single member.

As illustrated in FIG. 5, the first signal terminals 120a to 120v are supported by the signal terminal holding member 110. More specifically, the first signal terminals 120a to 120v are metal terminals having a rod shape extending in the upward-downward direction. A portion of the first signal terminals 120a to 120v is located in the signal terminal holding member lower portion 110a. That is, the first signal terminals 120a to 120v are molded by the signal terminal holding member lower portion 110a. However, the upper end portions of the first signal terminals 120a to 120k are located on the rear surface SB of the groove SL. The upper end portions of the first signal terminals 120l to 120v are located on the front surface SF of the groove SL. The lower end portions of the first signal terminals 120a to 120k are located on the rear surface of the signal terminal holding member tip portion 110c. The lower end portions of the first signal terminals 120l to 120v are located on the front surface of the signal terminal holding member tip portion 110c. In this manner, the upper end portions of the first signal terminals 120a to 120v and the lower end portions of the first signal terminals 120a to 120v are exposed from the signal terminal holding member 110.

In addition, as illustrated in FIG. 4, the first signal terminals 120a to 120k are aligned in a first row L1 extending in the rightward-leftward direction. In the present embodiment, the first signal terminals 120a to 120k are aligned in this order from a left side to a right side. The first signal terminals 120l to 120v are aligned in a second row L2 extending in the rightward-leftward direction. In the present embodiment, the first signal terminals 120l to 120v are aligned in this order from the left side to the right side. The second row L2 is located in front of the first row L1. A material of the first signal terminals 120a to 120v as described above is metal having elasticity. For example, the material of the first signal terminals 120a to 120v is phosphor bronze.

As illustrated in FIG. 4, the ground member 111 is disposed between the first row L1 and the second row L2. More specifically, as illustrated in FIG. 5, the ground member 111 includes a ground member main body 111a, ground member hook portions 111b and 111c, and ground member projecting portions 111d and 111e. The ground member main body 111a is a plate-shaped member having an oblong shape when viewed in the forward-rearward direction. A long side of the ground member main body 111a extends in the upward-downward direction. A short side of the ground member main body 111a extends in the rightward-leftward direction.

The ground member hook portion 111b extends in a leftward-upward direction from an upper end portion on a left long side of the ground member main body 111a when viewed in the forward-rearward direction. The ground member hook portion 111c extends in a rightward-upward direction from an upper end portion on a right long side of the ground member main body 111a when viewed in the forward-rearward direction.

The ground member projecting portion 111d projects in the leftward direction from the lower end portion on the left long side of the ground member main body 111a when viewed in the forward-rearward direction. The ground member projecting portion 111e projects in the rightward direction from the lower end portion on the right long side of the ground member main body 111a when viewed in the forward-rearward direction.

The ground member 111 as described above is located inside the through-hole H1 of the signal terminal holding member lower portion 110a, the signal terminal holding member upper portion 110b, and the signal terminal holding member tip portion 110c. In addition, the ground member hook portion 111b is located in the left end portion of the groove SL. The ground member hook portion 111c is located in the right end portion of the groove SL. As illustrated in FIG. 6, the ground member projecting portion 111d projects in the leftward direction from the signal terminal holding member tip portion 110c through the opening ha. The ground member projecting portion 111e projects in the rightward direction from the signal terminal holding member tip portion 110c through the opening hb. A material of the ground member 111 as described above is metal having elasticity. For example, the material of the ground member 111 is phosphor bronze.

The signal terminal holding member 110 as described above is located inside the cylindrical member 101 in the lower portion of the cylindrical member 101, and is held by the cylindrical member 101. More specifically, as illustrated in FIG. 2, the signal terminal holding member 110 is inserted into the plunger 102 corresponding to the lower portion of the cylindrical member 101. The signal terminal holding member lower portion 110a and the signal terminal holding member tip portion 110c are located inside the plunger lower portion 102a. However, the signal terminal holding member tip portion 110c projects in the downward direction from the plunger lower portion 102a. In addition, the ground member projecting portions 111d and 111e are in contact with the inner peripheral surface of the plunger 102. Therefore, the ground member 111 is in contact with the cylindrical member 101. In this manner, the ground member 111 is electrically connected to the plunger 102. The signal terminal holding member upper portion 110b is located inside the plunger upper portion 102b. In this manner, as illustrated in FIG. 4, the first signal terminals 120a to 120v are surrounded by the plunger 102 when viewed in the upward-downward direction.

As illustrated in FIGS. 6 to 8, the circuit substrate 112 includes a substrate main body 112*a*, signal wires Sa and Sb, and ground wires Ga and Gb. The substrate main body 112*a* has a plate shape having two main surfaces aligned in the forward-rearward direction. The substrate main body 112*a* has an oblong shape when viewed in the forward-rearward direction. The long side of the substrate main body 112*a* extends in the upward-downward direction. The short side of the substrate main body 112*a* extends in the rightward-leftward direction. In addition, the substrate main body 112*a* is provided with recessed portions ga and gb. The recessed portion ga is provided in the vicinity of the lower end on the left long side of the substrate main body 112*a*. The recessed portion ga is formed in such a manner that a portion on the left long side of the substrate main body 112*a* is recessed in the rightward direction. The recessed portion gb is provided in the vicinity of the lower end on the right long side of the substrate main body 112*a*. The recessed portion gb is formed in such a manner that a portion on the right long side of the substrate main body 112*a* is recessed in the leftward direction. In the circuit substrate 112 as described above, the width of the lower end portion of the circuit substrate 112 in the rightward-leftward direction coincides with a maximum value of the width of the circuit substrate 112 in the rightward-leftward direction.

The signal wires Sa and Sb and the ground wires Ga and Gb are provided in the substrate main body 112*a*. The signal wires Sa and Sb and the ground wires Ga and Gb extend in the upward-downward direction as illustrated in FIGS. 7 and 8. The ground wire Ga, the signal wires Sa and Sb, and the ground wire Gb are aligned in this order from the left side to the right side.

As illustrated in FIGS. 7 and 8, the signal wire Sa has a first end portion Ta1 located in the upper portion of the substrate main body 112*a* and a second end portion Ta2 located in the lower portion of the substrate main body 112*a*. The signal wire Sb has a first end portion Tb1 located in the upper portion of the substrate main body 112*a* and a second end portion Tb2 located in the lower portion of the substrate main body 112*a*. The first end portions Ta1 and Tb1 and the second end portions Ta2 and Tb2 are exposed from the substrate main body 112*a* on a rear main surface of the substrate main body 112*a*. In other words, the signal wires Sa and Sb are located inside the substrate main body 112*a* in a portion excluding the first end portions Ta1 and Tb1 and the second end portions Ta2 and Tb2. The first end portions Ta1 and Tb1 and the second end portions Ta2 and Tb2 function as electrodes. The circuit substrate 112 further includes one or more signal wires including end portions exposed on the front surface of the substrate main body 112*a*. However, the signal wires have a structure in the forward-rearward direction which is symmetrical with a structure of the signal wires Sa and Sb, and thus, description thereof is omitted.

As illustrated in FIGS. 7 and 8, the ground wire Ga includes a third end portion ta1 located in the upper portion of the substrate main body 112*a* and a fourth end portion ta2 located in the lower portion of the substrate main body 112*a*. The ground wire Gb includes a third end portion tb1 located in the upper portion of the substrate main body 112*a* and a fourth end portion tb2 located in the lower portion of the substrate main body 112*a*. The third end portions ta1 and tb1 are exposed from the substrate main body 112*a* on the rear main surface of the substrate main body 112*a*. The fourth end portions ta2 and tb2 are respectively located in the recessed portions ga and gb. That is, each of the fourth end portions ta2 and tb2 is exposed from the substrate main body

112*a* in the recessed portions ga and gb. In other words, the ground wires Ga and Gb are located inside the substrate main body 112*a* in a portion excluding the third end portions ta1 and tb1 and the fourth end portions ta2 and tb2. The third end portions ta1 and tb1 and the fourth end portions ta2 and tb2 function as electrodes. The circuit substrate 112 further includes one or more ground wires including end portions exposed on the front surface of the substrate main body 112*a* and in the recessed portions ga and gb. However, the ground wires have a structure in the forward-rearward direction which is symmetrical with structures of the ground wires Ga and Gb, and thus, description thereof is omitted.

As illustrated in FIG. 6, the circuit substrate 112 as described above is held by the signal terminal holding member 110. More specifically, the lower end portion of the circuit substrate 112 is inserted into the groove SL of the signal terminal holding member 110. In this case, as illustrated in FIG. 7, the second end portion Ta2 is electrically connected to the first signal terminal 120*c* (any one of the one or more first signal terminals). The second end portion Tb2 is electrically connected to the first signal terminal 120*e* (any one of the one or more first signal terminals).

In addition, as illustrated in FIG. 7, a portion of the ground member hook portion 111*b* is located inside the recessed portion ga. In this manner, the ground member hook portion 111*b* is in contact with the fourth end portion ta2. A portion of the ground member hook portion 111*b* is located inside the recessed portion gb. In this manner, the ground member hook portion 111*c* is in contact with the fourth end portion tb2. As a result, the ground member 111 is electrically connected to the fourth end portions ta2 and tb2. In this way, the circuit substrate 112 is detachably held by the signal terminal holding member 110 in such a manner that a portion of the signal terminal holding member 110 is hooked on the circuit substrate 112. In the present embodiment, the portion of the signal terminal holding member 110 is the ground member hook portions 111*b* and 111*c*. The ground member 111 is in contact with the fourth end portions ta2 and tb2 in such a manner that the ground member 111 is hooked on the recessed portions ga and gb. In the present specification, a fact that the first member is attachable to and detachable from the second member means that the first member and the second member can be isolated without damaging the first member and the second member. Therefore, the circuit substrate 112 is isolated from the signal terminal holding member 110 in such a manner that hooking of the ground member hook portions 111*b* and 111*c* is released from the circuit substrate 112.

As described above, the circuit substrate 112 is located inside the housing 104 in such a manner that the circuit substrate 112 is supported by the signal terminal holding member 110. However, as illustrated in FIG. 1, since the upper end of the circuit substrate 112 is located above the upper end of the cylindrical member 101, a portion of the circuit substrate 112 is visually recognized when viewed in a direction orthogonal to the upward-downward direction. That is, the circuit substrate 112 projects in the upward direction from the housing 104.

In addition, as illustrated in FIG. 9, the inner peripheral surface of the cylindrical member 101 has a circular shape when viewed in the upward-downward direction. The length of the substrate main body 112*a* in the rightward-leftward direction is substantially equal to a diameter of the inner peripheral surface of the cylindrical member 101.

The flange 106 is a member having a plate shape as illustrated in FIGS. 1 and 2. The flange 106 has an oblong shape when viewed in the downward direction. The flange 106 is disposed in the vicinity of the upper end portion of the housing 104 in the upward-downward direction. As illustrated in FIG. 2, the flange 106 is provided with a through-hole H2 extending in the upward-downward direction. The housing 104 passes through the inside of the through-hole H2 in the upward-downward direction. However, the diameter of the upper end portion of the housing 104 is larger than the diameter of the through-hole H2 of the flange 106. Therefore, the housing 104 cannot pass through the through-hole H2 in the downward direction. This flange 106 is manufactured by using metal having high conductivity. For example, the flange 106 is manufactured by using SUS.

The spring 108 is located below the flange 106 and on the plunger 102. The spring 108 pushes the flange 106 in the upward direction. The spring 108 pushes the plunger 102 in the downward direction. More specifically, the upper end of the spring 108 is fixed to the lower surface of the flange 106. The lower end of the spring 108 is fixed to the upper end of the plunger 102. The plunger 102 and the housing 104 are integrated. Therefore, when the plunger 102 is pushed in the upward direction, the spring 108 contracts, and the plunger 102 and the housing 104 are displaced in the upward direction with respect to the flange 106.

As illustrated in FIG. 10, the external connecting connector 200a includes signal terminals 202a, 204a, and 206a, a ground conductor 208a, and an insulating member 210a. The signal terminals 202a, 204a, and 206a extend in the upward-downward direction. The signal terminals 202a, 204a, and 206a are aligned in this order from the left side to the right side. The ground conductor 208a surrounds the periphery of the upper end portions of the signal terminals 202a, 204a, and 206a when viewed in the forward-rearward direction. The insulating member 210a holds the signal terminals 202a, 204a, and 206a and the ground conductor 208a. This external connecting connector 200a is mounted on the rear main surface of the substrate main body 112a by soldering. In this manner, the signal terminals 202a and 206a are respectively electrically connected to the first end portions Ta1 and Tb1. The ground conductor 208a is electrically connected to the third end portions ta1 and tb1. The external connecting connector 200b has a structure in the forward-rearward direction which is symmetrical with a structure of the external connecting connector 200a. Therefore, description of the external connecting connector 200b is omitted.

A connector 300a to which the coaxial cables 400a and 400b are connected is connected to the external connecting connector 200a. A connector 300b to which the coaxial cables 400c and 400d are connected is connected to the external connecting connector 200b. Hereinafter, the coaxial cable 400a and the connector 300a will be described as an example.

The coaxial cable 400a electrically connects an inspection device (not illustrated) and the connector 300a to each other. As illustrated in FIG. 11, the coaxial cable 400a includes a central conductor 402a, an outer conductor 404a, an insulator 406a, and a coating 408a. The central conductor 402a is a core wire of the coaxial cable 400a. Therefore, the central conductor 402a is located in the center of the coaxial cable 400a. The central conductor 402a is manufactured by using a conductor having a low resistance value. For example, the central conductor 402a is manufactured by using copper. A high frequency signal is transmitted to the central conductor 402a.

The outer conductor 404a surrounds the periphery of the central conductor 402a. Therefore, the outer conductor 404a has an annular shape in a cross section orthogonal to an extending direction of the coaxial cable 400a. For example, this outer conductor 404a is manufactured by knitting a thin conducting wire. The outer conductor 404a is manufactured by using a conductor having a low resistance value. For example, the outer conductor 404a is manufactured by using copper. The outer conductor 404a is connected to a ground potential.

The insulator 406a insulates the central conductor 402a and the outer conductor 404a from each other. The insulator 406a is located between the central conductor 402a and the outer conductor 404a. The insulator 406a surrounds the periphery of the central conductor 402a. The periphery of the insulator 406a is surrounded by the outer conductor 404a. The insulator 406a has an annular shape in a cross section orthogonal to the extending direction of the coaxial cable 400a. The insulator 406a is manufactured by using a resin having insulating properties. For example, the insulator 406a is manufactured by using polyethylene. In addition, the insulator 406a is provided with a plurality of holes so that the coaxial cable 400a can flexibly deform.

The coating 408a surrounds the periphery of the outer conductor 404a. Therefore, the coating 408a has an annular shape in a cross section orthogonal to the extending direction of the coaxial cable 400a. The coating 408a is manufactured by using a resin having insulating properties. For example, the coating 408a is manufactured by using polyethylene. However, the coating 408a is not provided with a plurality of holes, or is provided with holes fewer than holes of the insulator 406a. Therefore, the coating 408a is less likely to deform than the insulator 406a. Therefore, the Young's modulus of the coating 408a is larger than the Young's modulus of the insulator 406a.

The central conductor 402a is exposed from the coaxial cable 400a in such a manner that the outer conductor 404a, the insulator 406a, and the coating 408a are removed in the lower end portion of the coaxial cable 400a. In addition, the outer conductor 404a is exposed from the coaxial cable 400a in such a manner that the coating 408a is removed above a portion where the central conductor 402a is exposed. The coaxial cables 400b to 400d have the same structure as that of the coaxial cable 400a. Therefore, description of the coaxial cables 400b to 400d is omitted.

As illustrated in FIG. 11, the connector 300a includes signal terminals 302a, 304a, and 306a, a ground conductor 308a, and an insulating member 310a. The signal terminals 302a, 304a, and 306a extend in the upward-downward direction. The signal terminals 302a, 304a, and 306a are aligned in this order from the left side to the right side. The upper end portion of the signal terminal 302a is electrically connected to the central conductor 402a of the coaxial cable 400a. The upper end portion of the signal terminal 306a is electrically connected to a central conductor 402b (not illustrated) of the coaxial cable 400b.

The ground conductor 308a surrounds the periphery of the lower end portions of the signal terminals 302a, 304a, and 306a when viewed in the forward-rearward direction. The ground conductor 308a holds the outer conductor 404a of the coaxial cable 400a and the outer conductor 404b (not illustrated) of the coaxial cable 400b. In this manner, the ground conductor 308a is electrically connected to the outer conductors 404a and 404b. The connector 300b has the same structure as that of the connector 300a. Therefore, description of the connector 300b is omitted.

The connector 300a as described above is connected to the external connecting connector 200a. In this case, the signal terminals 302a, 304a, and 306a are respectively connected to the signal terminals 202a, 204a, and 206a. As a result, the first end portion Ta1 is electrically connected to the central conductor 402a (any one of the one or more central conductors). The first end portion Tb1 is electrically connected to the central conductor 402b (any one of the one or more central conductors, not illustrated). The ground conductor 308a is connected to the ground conductor 208a. As a result, the third end portion ta1 is electrically connected to the outer conductor 404a (any one or more of the one or more outer conductors). The third end portion tb1 is electrically connected to the outer conductor 404b (any one or more of the one or more outer conductors, not illustrated).

Figure 12:
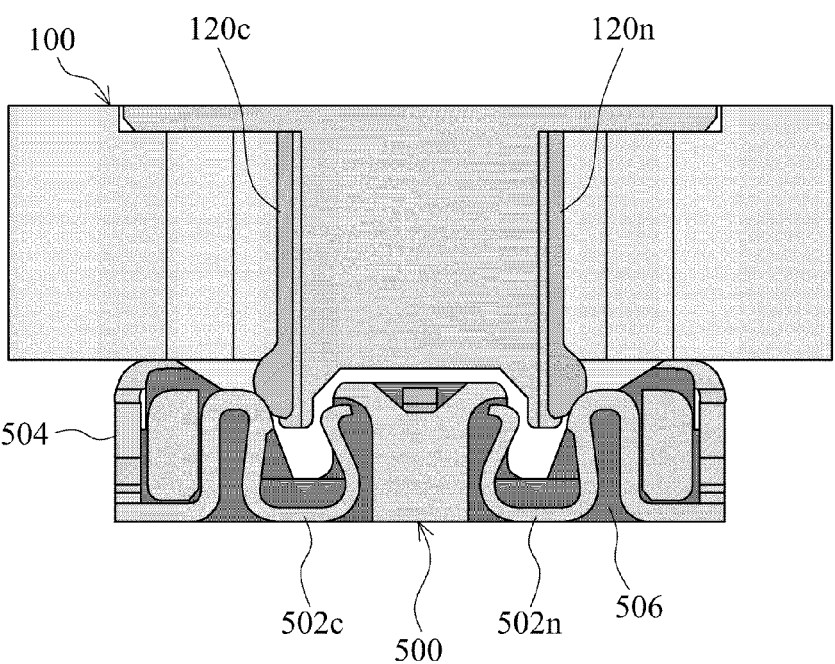
FIG. 12 is a sectional view of the inspection connector and a mating connector.

Next, a method of using the inspection connector 100 will be described. FIG. 12 is a sectional view of the inspection connector 100 and a mating connector 500.

First, the mating connector 500 will be described. As illustrated in FIG. 12, the mating connector 500 includes second signal terminals 502a to 502v (only the second signal terminals 502c and 502n are illustrated), a ground conductor 504, and an insulating member 506. The second signal terminals 502a to 502k are aligned in this order from the left side to the right side. The second signal terminals 502l to 502v are aligned in this order from the left side to the right side. Each of the second signal terminals 502l to 502v is located in front of the second signal terminals 502a to 502k. The ground conductor 504 surrounds the periphery of the second signal terminals 502a to 502v. The ground conductor 504 is connected to the ground potential. The insulating member 506 holds the second signal terminals 502a to 502v and the ground conductor 504. The mating connector 500 as described above is mounted on the circuit substrate of the electronic device.

The inspection connector 100 is used to inspect the electronic device including the mating connector 500 including the second signal terminals 502a to 502v as described above. As illustrated in FIG. 12, the inspection connector 100 is set on the mating connector 500. The inspection connector 100 is lowered. In this manner, each of the first signal terminals 120a to 120v is electrically connected to any one of the second signal terminals 502a to 502v. In addition, the cylindrical member 101 is electrically connected to the ground conductor 504. In this manner, the electronic device can be inspected.

According to the inspection connector 100, the circuit substrate 112 can be easily attached and detached. More specifically, in the inspection connector 100, the upper end of the circuit substrate 112 is located above the upper end of the cylindrical member 101. In this manner, a portion of the circuit substrate 112 is visually recognized when viewed in a direction orthogonal to the upward-downward direction. In this manner, a user can directly touch the circuit substrate 112. As a result, the user can easily attach and detach the circuit substrate 112.

According to the inspection connector 100, the circuit substrate 112 can be easily attached and detached. The circuit substrate 112 is detachably held by the signal terminal holding member 110 in such a manner that a portion of the signal terminal holding member 110 is hooked on the circuit substrate 112. In this manner, the user can attach the circuit substrate 112 to the inspection connector 100 by hooking the portion of the signal terminal holding member 110 on the circuit substrate 112. On the other hand, the user can detach the circuit substrate 112 from the inspection connector 100 by detaching the portion of the signal terminal holding member 110 from the circuit substrate 112.

According to the inspection connector 100, the circuit substrate 112 can be easily attached to the inspection connector 100. More specifically, the signal terminal holding member 110 is provided with the groove SL open in the upward direction and extending in the rightward-leftward direction. An inner peripheral surface of the groove SL has a front surface SF and a rear surface SB which face each other. An upper end portion of the front surface SF has a normal line extending in a rearward-upward direction. An upper end portion of the rear surface SB has a normal line extending in a forward-upward direction. In this manner, when the lower end portion of the circuit substrate 112 is inserted into the groove SL, the lower end portion of the circuit substrate 112 is guided to the groove SL by the front surface SF and the rear surface SB. As a result, according to the inspection connector 100, the circuit substrate 112 can be easily attached to the inspection connector 100.

According to the inspection connector 100, the circuit substrate 112 can be easily attached to the inspection connector 100. More specifically, the inner peripheral surface of the cylindrical member 101 has a circular shape when viewed in the upward-downward direction. The length of the substrate main body 112a in the rightward-leftward direction is substantially equal to the diameter of the inner peripheral surface of the cylindrical member 101. In this manner, when the user inserts the circuit substrate 112 into the cylindrical member 101, inclination of the circuit substrate 112 with respect to the cylindrical member 101 is suppressed. As a result, displacement of the circuit substrate 112 with respect to the signal terminal holding member 110 is suppressed. Therefore, according to the inspection connector 100, the circuit substrate 112 can be easily attached to the inspection connector 100.

According to the inspection connector 100, desired characteristic impedance (for example, 50Ω) can be generated in the first signal terminals 120c and 120e. More specifically, the ground member 111 is electrically connected to the fourth end portions ta2 and tb2 of the ground wire Ga and Gb. The ground member 111 is in contact with the cylindrical member 101. In this manner, the cylindrical member 101 is connected to the ground potential. Therefore, the first signal terminals 120c and 120e are surrounded by the cylindrical member 101 connected to the ground potential when viewed in the upward-downward direction. That is, the first signal terminals 120c and 120e and the cylindrical member 101 have coaxial structures. As a result, according to the inspection connector 100, desired characteristic impedance can be generated in the first signal terminals 120c and 120e.

In the inspection connector 100, the first signal terminals 120a to 120k are aligned in the first row L1. The first signal terminals 120l to 120v are aligned in the second row L2. The ground member 111 is located between the first row L1 and the second row L2. The ground member 111 is connected to the ground potential. Therefore, a shield exists between the first signal terminals 120a to 120k and the first signal terminals 120l to 120v. Therefore, noise transmitting between the first signal terminals 120a to 120k and the first signal terminals 120l to 120v is suppressed. In addition, capacitance is formed between the ground member 111 and the first signal terminals 120a to 120v. Therefore, desired characteristic impedance can be generated in the first signal terminals 120a to 120v.

In the inspection connector 100, the width of the lower end portion of the circuit substrate 112 in the rightward-leftward direction is the maximum value of the width of the circuit substrate 112 in the rightward-leftward direction. In this manner, the user can visually recognize the lower end portion of the circuit substrate 112 when viewed in the downward direction. That is, the user can visually recognize that the lower end of the circuit substrate 112 is inserted into the signal terminal holding member 110.

According to the inspection connector 100, versatility of the inspection connector 100 can be improved. More specifically, in the inspection connector 100, the circuit substrate 112 can be replaced. Therefore, the first signal terminals connected to the central conductors 402a to 402d can be changed by replacing the circuit substrate 112. As a result, the inspection connector 100 can be used to inspect wider types of electronic devices. As described above, according to the inspection connector 100, versatility of the inspection connector 100 can be improved.

First Modification Example

Figure 13:
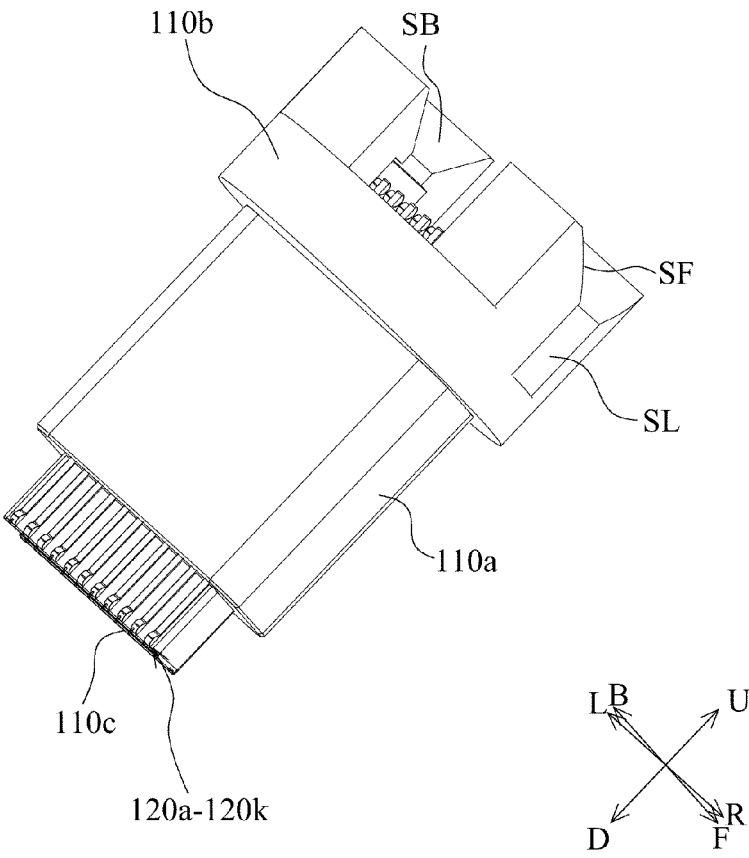
FIG. 13 is a perspective view of the signal terminal holding member of an inspection connector.
Figure 14:
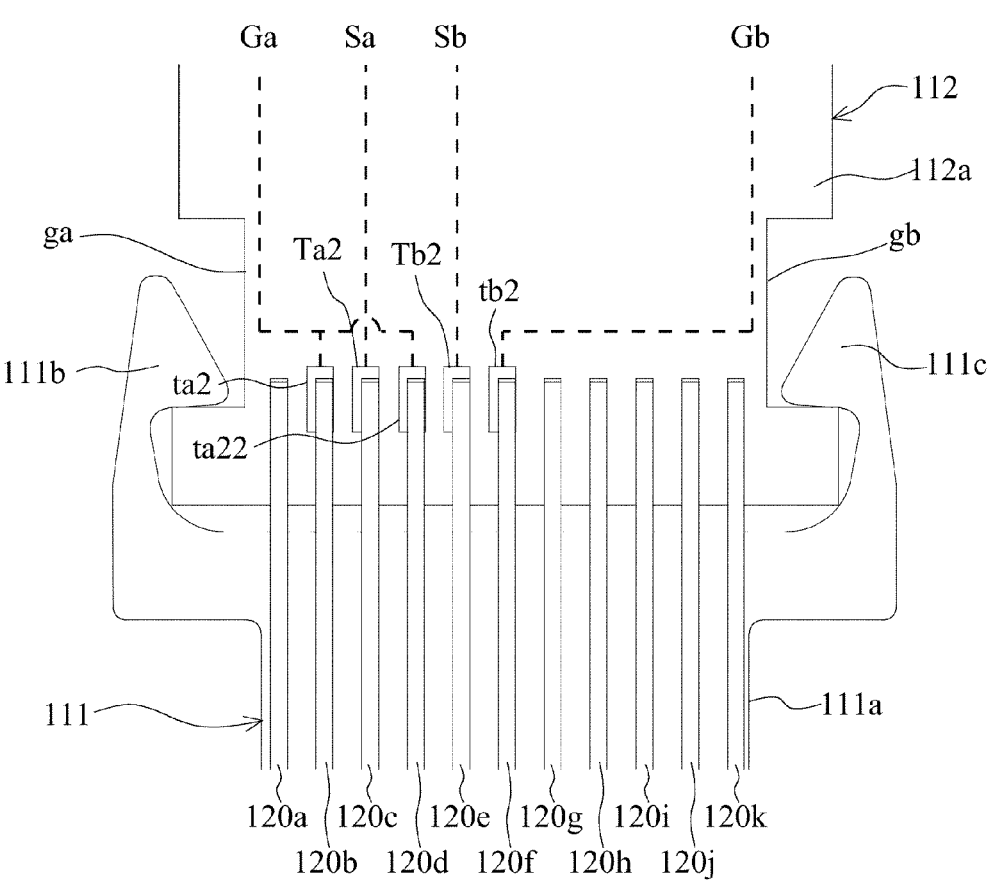
FIG. 14 is a rear view of the first signal terminals and the circuit substrate.

Hereinafter, an inspection connector 100a according to a first modification example will be described with reference to the drawings. FIG. 13 is a perspective view of the signal terminal holding member 110 of the inspection connector 100a. FIG. 14 is a rear view of the first signal terminals 120a to 120k and the circuit substrate 112.

The inspection connector 100a is different from the inspection connector 100 in that the ground member 111 is not provided. The fourth end portions ta2 and ta22 are end portions of the ground wire Ga. The fourth end portion tb2 is an end portion of the ground wire Gb. In the inspection connector 100a, each of the fourth end portions ta2, ta22, and tb2 is exposed from the substrate main body 112a on the rear main surface of the substrate main body 112a.

The fourth end portion ta2 is electrically connected to the first signal terminal 120b (any one of the one or more first signal terminals). The fourth end portion ta22 is electrically connected to the first signal terminal 120d (any one of the one or more first signal terminals). In this manner, the first signal terminals 120b and 120d to which the fourth end portions ta2 and ta22 are electrically connected and the first signal terminal 120c to which the second end portion Ta2 is electrically connected are adjacent to each other.

The fourth end portion tb2 is electrically connected to the first signal terminal 120f (any one of the one or more first signal terminals). In this manner, the first signal terminals 120d and 120f to which the fourth end portions ta22 and tb2 are electrically connected and the first signal terminal 120e to which the second end portion Tb2 is electrically connected are adjacent to each other.

In the inspection connector 100a, the cylindrical member 101 may be connected to the ground potential, or does not need to be connected to the ground potential. Other structures of the inspection connector 100a are the same as those of the inspection connector 100, and thus, description thereof is omitted. The inspection connector 100a can achieve the same operational effect as that of the inspection connector 100.

Second Modification Example

Figure 15:
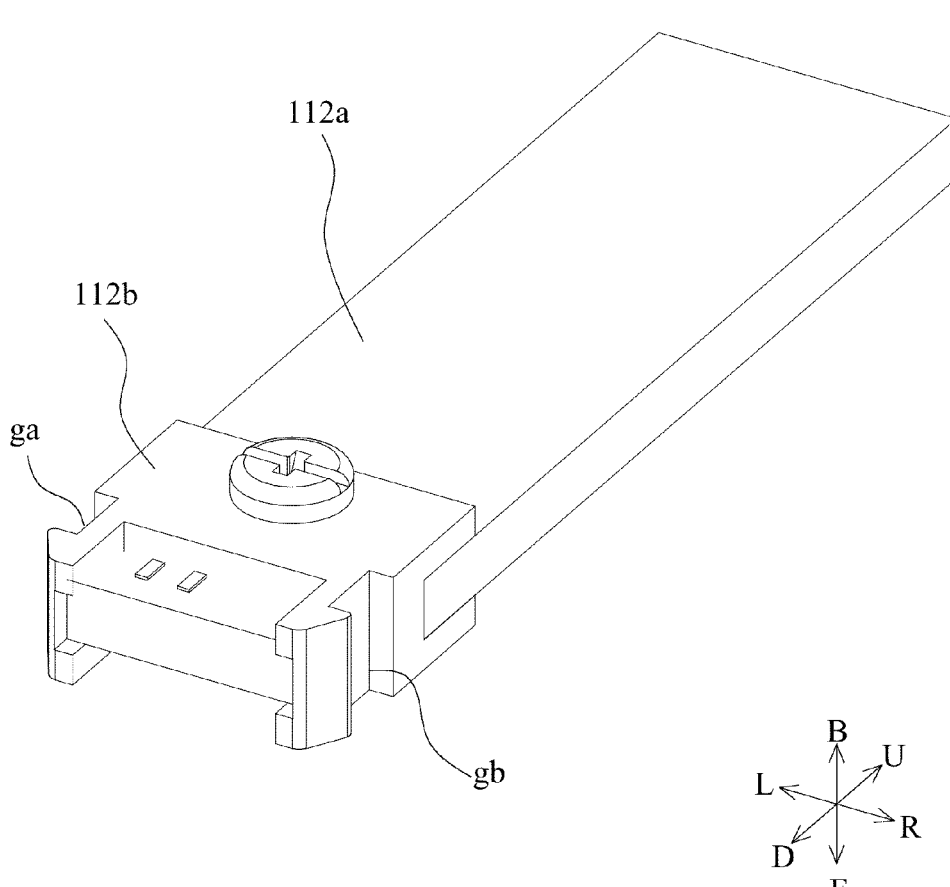
FIG. 15 is a perspective view of the circuit substrate of an inspection connector.

Hereinafter, an inspection connector 100b according to a second modification example will be described with reference to the drawings. FIG. 15 is a perspective view of the circuit substrate 112 of the inspection connector 100b.

The inspection connector 100b is different from the inspection connector 100 in that the circuit substrate 112 further includes a metal member 112b. More specifically, the metal member 112b is fixed to the lower end portion of the substrate main body 112a, and is electrically connected to the fourth end portions ta2 and tb2. The circuit substrate 112 is detachably held by the signal terminal holding member

110 in such a manner that a portion of the signal terminal holding member 110 is hooked on the metal member 112b. In the present embodiment, the ground member hook portions 111b and 111c of the ground member 111 are hooked on the metal member 112b. For example, a material of the metal member 112b is SUS. Other structures of the inspection connector 100b are the same as those of the inspection connector 100, and thus, description thereof is omitted. The inspection connector 100b can achieve the same operational effect as that of the inspection connector 100.

In addition, the ground member hook portions 111b and 111c are hooked on the metal member 112b. In this manner, when the inspection connector 100b is used, even when friction is generated between the ground member hook portions 111b and 111c and the metal member 112b, the ground member hook portions 111b and 111c and the metal member 112b are less likely to wear. Therefore, durability of the inspection connector 100b is improved.

Third Modification Example

Figure 16:
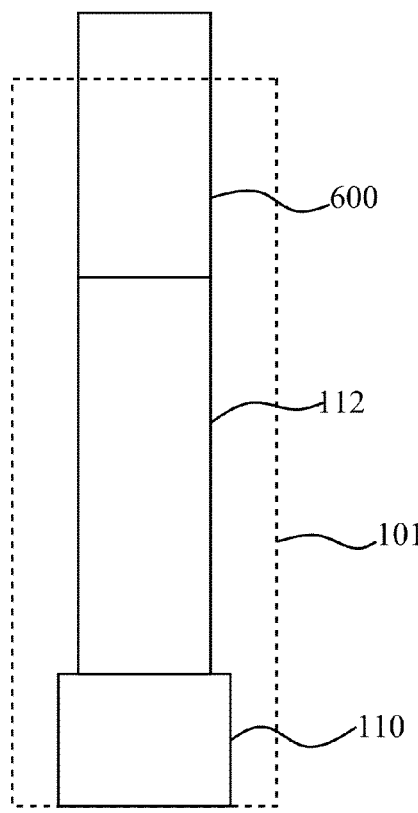
FIG. 16 is a rear view of an inspection connector.

Hereinafter, an inspection connector 100c according to a third modification example will be described with reference to the drawings. FIG. 16 is a rear view of the inspection connector 100c.

The inspection connector 100c is different from the inspection connector 100 in that a holding member 600 fixed to the circuit substrate 112 is further provided to be located on the circuit substrate 112. The upper end of the holding member 600 is located above the upper end of the cylindrical member 101. In this manner, a portion of the holding member 600 is visually recognized when viewed in a direction orthogonal to the upward-downward direction. Other structures of the inspection connector 100c are the same as those of the inspection connector 100, and thus, description thereof is omitted. The inspection connector 100c can achieve the same operational effect as that of the inspection connector 100.

In addition, according to the inspection connector 100c, the circuit substrate 112 can be easily attached and detached. More specifically, in the inspection connector 100, the upper end of the holding member 600 is located above the upper end of the cylindrical member 101. In this manner, a portion of the holding member 600 is visually recognized when viewed in a direction orthogonal to the upward-downward direction. In this manner, the user can directly touch the holding member 600. The holding member 600 is fixed to the circuit substrate 112. Therefore, the user can easily attach and detach the circuit substrate 112 by operating the holding member 600.

Second Embodiment

Figure 17:
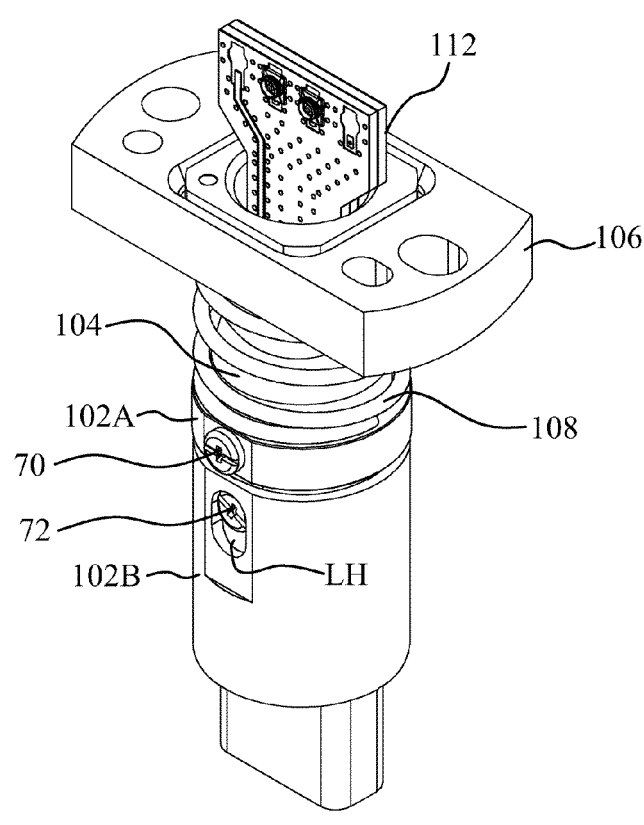
FIG. 17 is an outer perspective view of an inspection connector.
Figure 17:
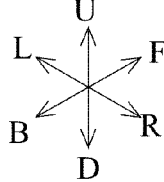
Figure 18:
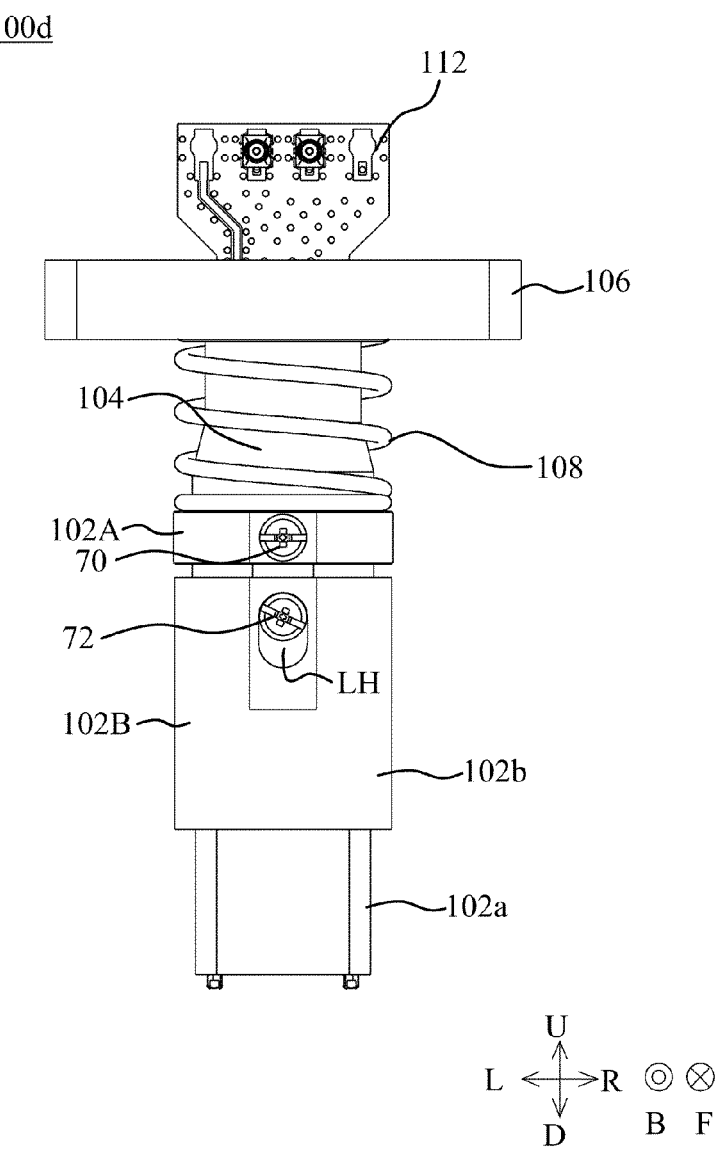
FIG. 18 is a rear view of the inspection connector.
Figure 19:
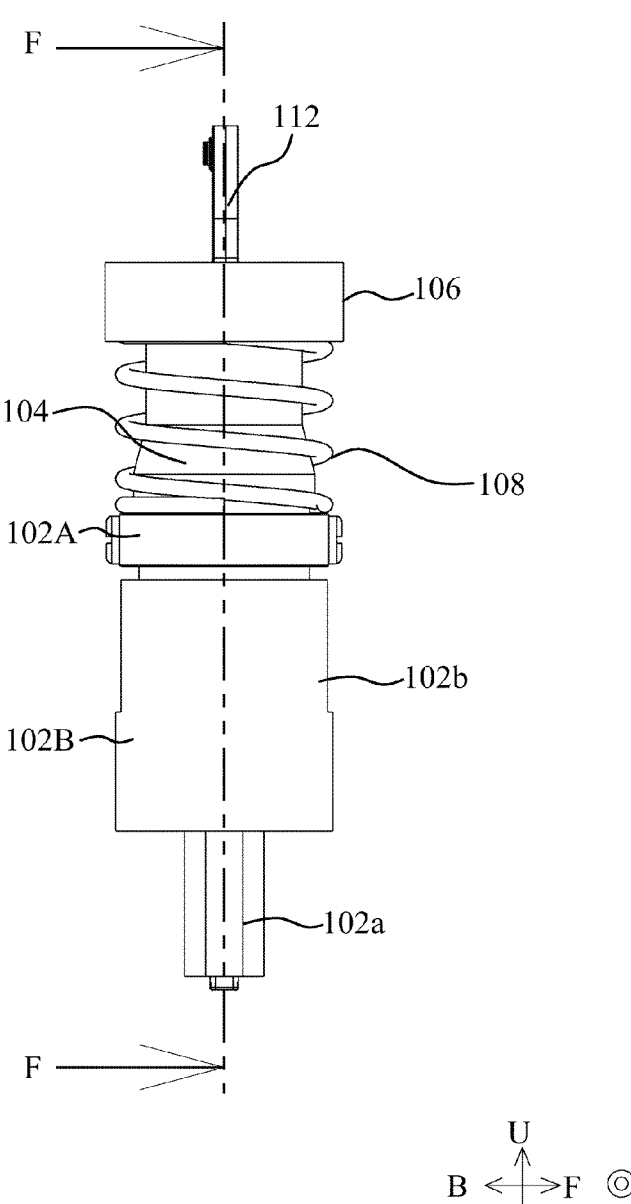
FIG. 19 is a right side view of the inspection connector.
Figure 20:
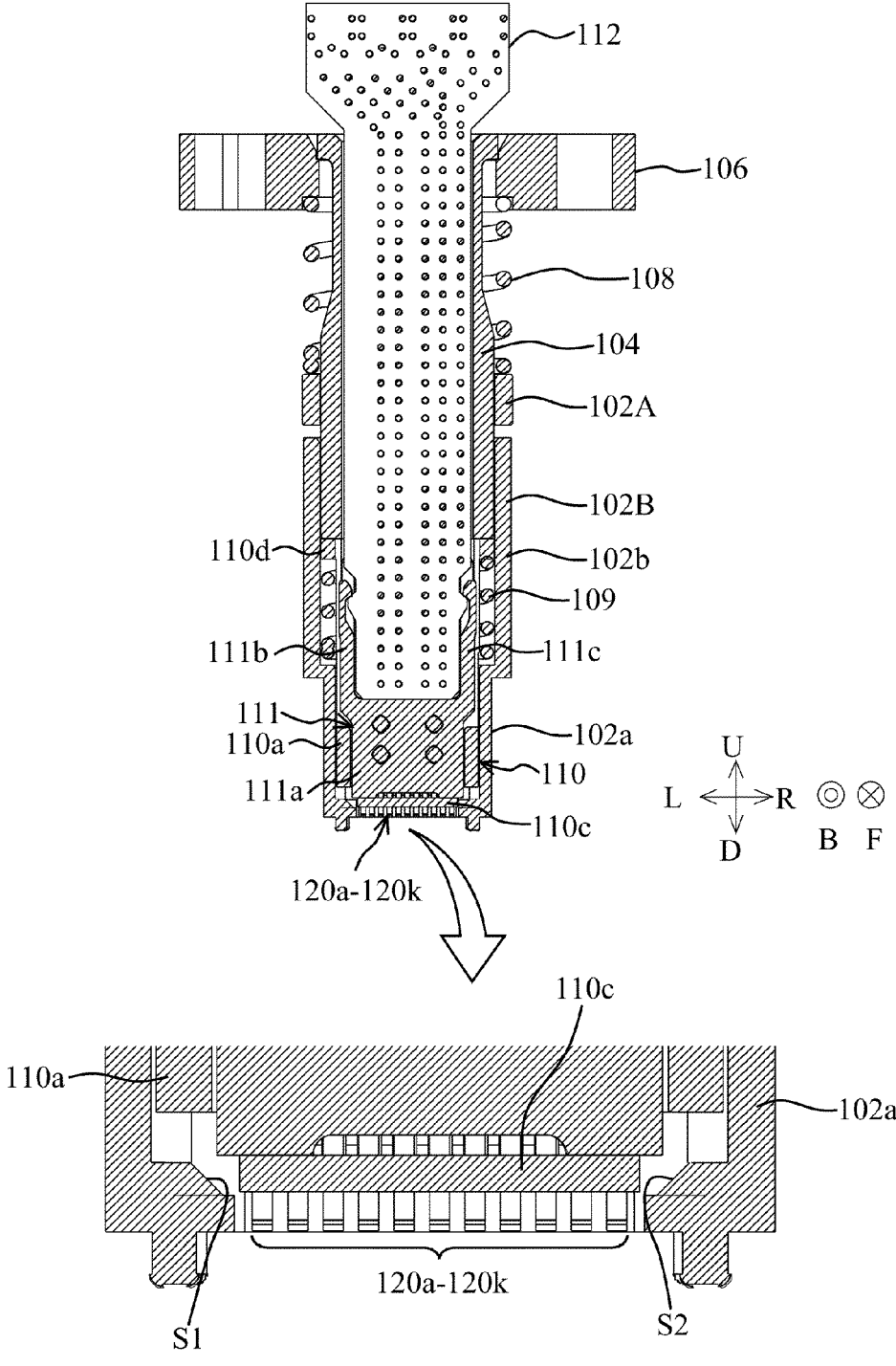
FIG. 20 is a sectional view taken along line F-F in FIG. 19.
Figure 21:
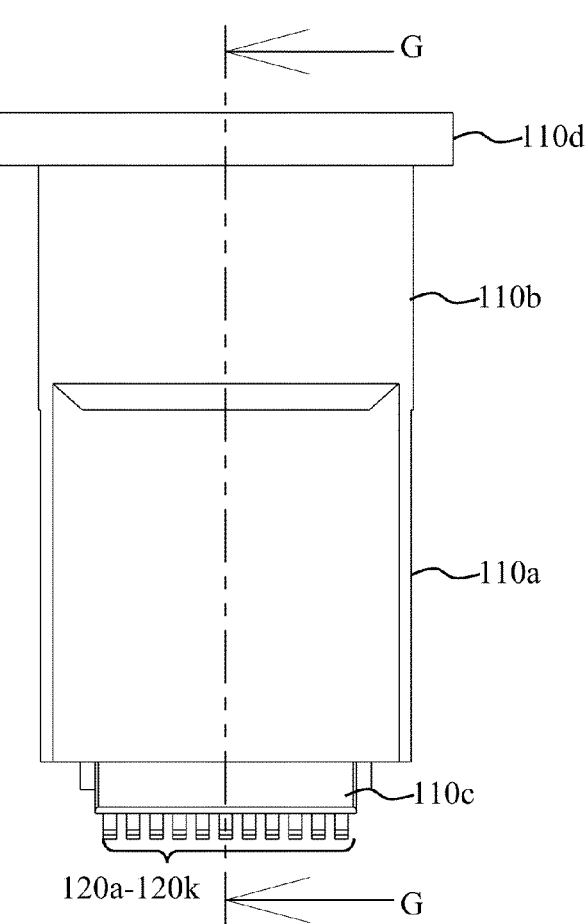
FIG. 21 is a rear view of the signal terminal holding member.
Figure 22:
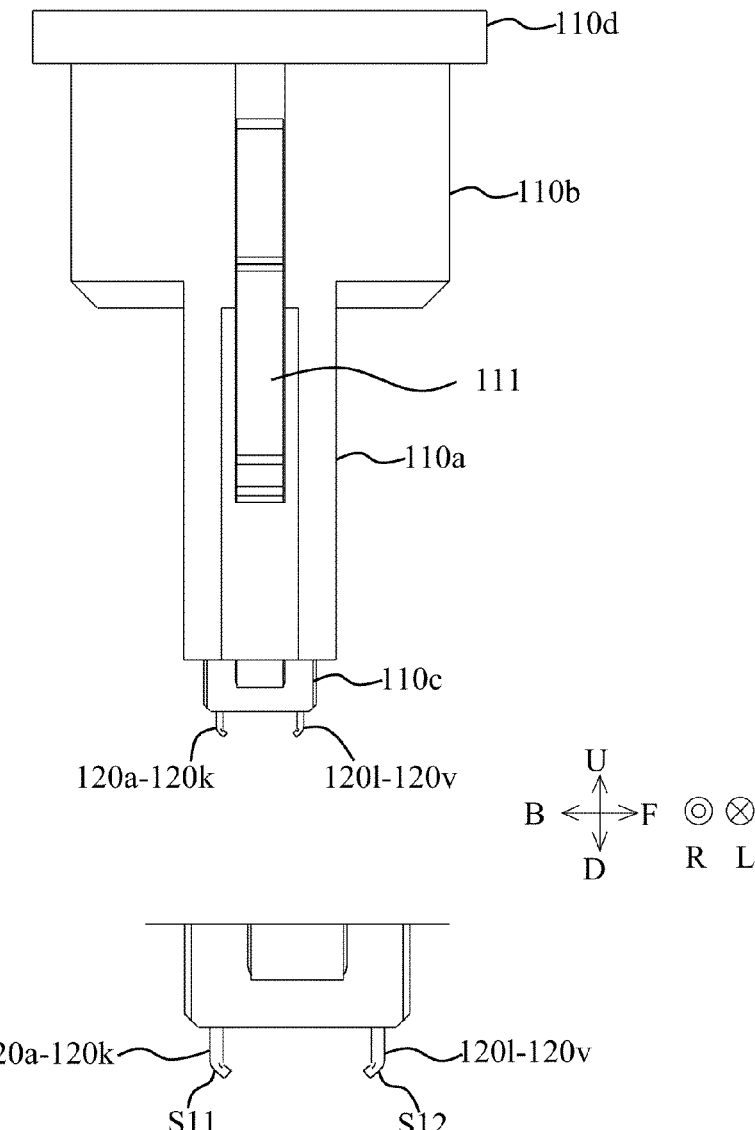
FIG. 22 is a right side view of the signal terminal holding member.
Figure 23:
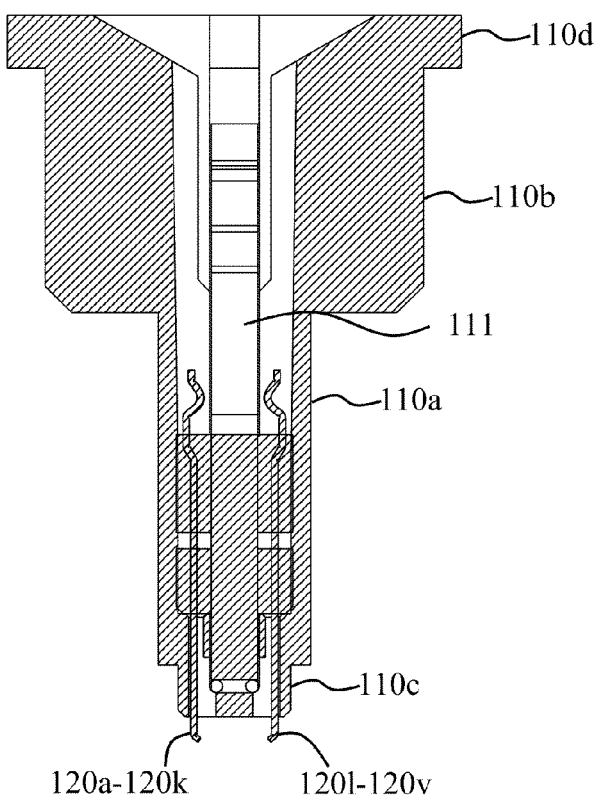
FIG. 23 is a sectional view taken along line G-G in FIG. 22.
Figure 24:
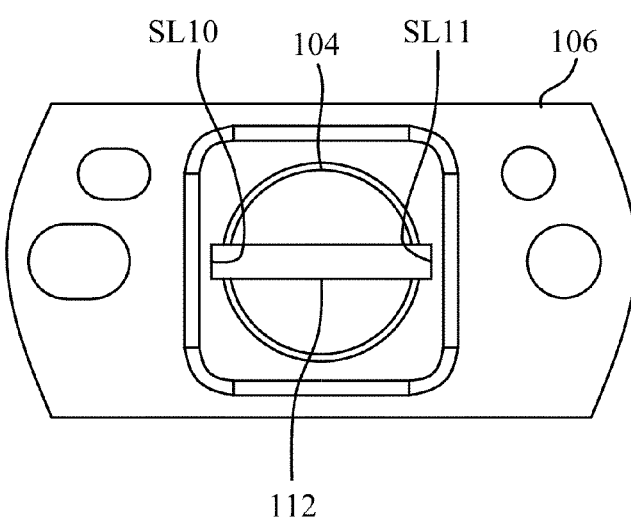
FIG. 24 is a top view of the inspection connector.

Hereinafter, an inspection connector 100d according to a second embodiment will be described with reference to the drawings. FIG. 17 is an outer perspective view of the inspection connector 100d. FIG. 18 is a rear view of the inspection connector 100d. FIG. 19 is a right side view of the inspection connector 100d. FIG. 20 is a sectional view taken along line F-F in FIG. 19. FIG. 21 is a rear view of the signal terminal holding member 110. FIG. 22 is a right side view of the signal terminal holding member 110. FIG. 23 is a sectional view taken along line G-G in FIG. 22. FIG. 24 is a top view of the inspection connector 100d.

Different points between the inspection connector 100d and the inspection connector 100 will be mainly described. As illustrated in FIGS. 17 to 20, the inspection connector 100d includes a first plunger 102A and a second plunger 102B instead of the plunger 102. In addition, the inspection connector 100d further includes a spring 109 as illustrated in FIG. 20.

The first plunger 102A and the second plunger 102B are cylindrical members having a cylindrical shape having the central axis line extending in the upward-downward direction. The first plunger 102A is located on the second plunger 102B. The second plunger 102B includes a plunger lower portion 102a and a plunger upper portion 102b. Structures of the plunger lower portion 102a and the plunger upper portion 102b of the inspection connector 100d are the same as those of the plunger lower portion 102a and the plunger upper portion 102b of the inspection connector 100, and thus, description thereof is omitted.

The lower portion of the housing 104 is inserted into the first plunger 102A and the second plunger 102B. As illustrated in FIG. 17, the first plunger 102A is fixed to the housing 104 by a screw 70 In addition, a long hole LH having a longitudinal direction in the upward-downward direction is provided on the front surface of the second plunger 102B. A screw 72 is inserted into the long hole LH. The screw 72 is fixed to the housing 104. In this manner, the second plunger 102B can move in the upward-downward direction with respect to the housing 104. However, the width in which the second plunger 102B can move in the upward-downward direction is limited to the length of the long hole LH in the upward-downward direction.

As illustrated in FIG. 20, the spring 109 is provided below the housing 104 and inside the plunger upper portion 102b of the second plunger 102B. The upper end of the spring 109 is in contact with the lower surface of a signal terminal holding member flange portion 110d (to be described in detail later). The lower end of the spring 109 is in contact with the upper end of the plunger lower portion 102a. In this manner, the spring 109 pushes the second plunger 102B in the downward direction with respect to the housing 104 and the signal terminal holding member 110. Therefore, as illustrated in the enlarged view in FIG. 20, the first signal terminals 120a to 120v do not project from the plunger lower portion 102a.

The inspection connector 100d has the above-described structure. In this manner, when the mating connector 500 pushes the second plunger 102B in the upward direction, the second plunger 102B can move in the upward direction with respect to the housing 104 and the signal terminal holding member 110. In other words, the housing 104 and the signal terminal holding member 110 can move in the downward direction with respect to the second plunger 102B. In this manner, the first signal terminals 120a to 120v project in the downward direction from the plunger lower portion 102a. As a result, the first signal terminals 120a to 120v can come into contact with the second signal terminals 502a to 502v of the mating connector 500.

In addition, the inner surface of the plunger lower portion 102a is provided with inclined surfaces S1 and S2 as illustrated in FIG. 20. The inclined surface S1 is located on the left side of the signal terminal holding member tip portion 110c. The inclined surface S1 faces the rightward-upward direction. The inclined surface S2 is located on the right side of the signal terminal holding member tip portion 110c. The inclined surface S2 faces the leftward-upward direction. In this manner, when the first signal terminals 120a to 120v move in the downward direction with respect to the second plunger 102B, in a case where the signal terminal holding member tip portion 110c is displaced in the leftward direction, the signal terminal holding member tip portion 110c comes into contact with the inclined surface S1. Since the signal terminal holding member tip portion 110c slides on the inclined surface S1 in the rightward-downward direction, the first signal terminals 120a to 120v project in the downward direction from the plunger lower portion 102a. Similarly, when the first signal terminals 120a to 120v move in the downward direction with respect to the second plunger 102B, in a case where the signal terminal holding member tip portion 110c is displaced in the rightward direction, the signal terminal holding member tip portion 110c comes into contact with the inclined surface S2. Since the signal terminal holding member tip portion 110c slides on the inclined surface S2 in the leftward-downward direction, the first signal terminals 120a to 120v project in the downward direction from the plunger lower portion 102a.

Next, a structure of the signal terminal holding member 110 will be described. The signal terminal holding member 110 of the inspection connector 100d is different from the signal terminal holding member 110 of the inspection connector 100 in that the signal terminal holding member flange portion 110d is provided. As illustrated in FIGS. 21 and 22, the signal terminal holding member flange portion 110d is connected to the upper end of the signal terminal holding member upper portion 110b. The signal terminal holding member flange portion 110d projects in the forward-rearward direction and the rightward-leftward direction from the upper end of the signal terminal holding member upper portion 110b. The signal terminal holding member flange portion 110d has an annular shape when viewed in the upward-downward direction. As described above, the upper end of the spring 109 comes into contact with the signal terminal holding member flange portion 110d.

In addition, the signal terminal holding member 110 of the inspection connector 100d is different from the signal terminal holding member 110 of the inspection connector 100 in a shape of the signal terminal holding member upper portion 110b. More specifically, as illustrated in FIGS. 21 and 22, the signal terminal holding member upper portion 110b has a columnar shape having the central axis line extending in the upward-downward direction. In addition, the signal terminal holding member upper portion 110b has the front surface SF and the rear surface SB. The front surface SF has a normal line extending in the rearward-upward direction. The rear surface SB has a normal line extending in the forward-upward direction. The front surface SF and the rear surface SB are inclined by 60° with respect to the upward-downward direction. In this manner, a distance between the front surface SF and the rear surface SB in the forward-rearward direction increases upward. In this manner, when the lower end portion of the circuit substrate 112 is inserted into the groove SL, the lower end portion of the circuit substrate 112 is guided to the groove SL by the front surface SF and the rear surface SB. However, an angle formed by the front surface SF and the rear surface SB with respect to the upward-downward direction is not limited to 60°.

In addition, the front surface and the rear surface of the signal terminal holding member lower portion 110a are flat surfaces. In this manner, gaps are formed between the front surface of the signal terminal holding member lower portion 110a and the inner peripheral surface of the plunger lower portion 102a and between the rear surface of the signal terminal holding member lower portion 110a and the inner peripheral surface of the plunger lower portion 102a. Other structures of the signal terminal holding member 110 of the inspection connector 100d are the same as those of the signal terminal holding member 110 of the inspection connector 100, and thus, description thereof is omitted.

The structure of the ground member 111 of the inspection connector 100d is substantially the same as that of the inspection connector 100d, as illustrated in FIGS. 5 and 20. Therefore, the ground member 111 includes the ground member main body 111a and the ground member hook portions 111b and 111c. The ground member main body 111a is inserted into the through-hole H1 of the signal terminal holding member lower portion 110a and the signal terminal holding member upper portion 110b. The ground member hook portions 111b and 111c are hooked on the circuit substrate 112. In this manner, the circuit substrate 112 is detachably held by the signal terminal holding member 110. Furthermore, as in the inspection connector 100, in the inspection connector 100d, the ground potential is connected to the circuit substrate 112 by the ground member 111.

In addition, as illustrated in FIGS. 22 and 23, the first signal terminals 120a to 120k are bent in the forward direction in the lower end portions of the first signal terminals 120a to 120k. In this manner, the lower end portions of the first signal terminals 120a to 120k have an inclined surface S11 facing the rearward-downward direction. Similarly, the first signal terminals 120l to 120v are bent in the rearward direction in the lower end portions of the first signal terminals 120l to 120v. In this manner, the lower end portions of the first signal terminals 120l to 120v have an inclined surface S12 facing the forward-downward direction.

When the inspection connector 100d is attached to the mating connector 500 (refer to FIG. 12), the first signal terminals 120a to 120k respectively come into contact with the second signal terminals 502a to 502k (refer to FIG. 12) on the inclined surface S11. The second signal terminals 502a to 502k respectively push the first signal terminals 120a to 120k in the forward direction while sliding on the inclined surface S11 of the first signal terminals 120a to 120k. As a result, the first signal terminals 120a to 120k elastically deform to be bent in the forward direction. In this manner, the first signal terminals 120a to 120k respectively come into contact with the second signal terminals 502a to 502k. Similarly, the second signal terminals 502l to 502v respectively push the first signal terminals 120l to 120v in the rearward direction while sliding on the inclined surface S12 of the first signal terminals 120l to 120v. As a result, the first signal terminals 120l to 120v elastically deform to be bent in the rearward direction. In this manner, even when there is a position displacement between the first signal terminals 120l to 120v and the second signal terminals 502l to 502v, the first signal terminals 120l to 120v can respectively come into contact with the second signal terminals 502l to 502v.

An angle at which the lower end portions of the first signal terminals 120a to 120v are bent is an obtuse angle. However, the angle at which the lower end portions of the first signal terminals 120a to 120v are bent is not limited to the obtuse angle, and may be 90 degrees. Even in this case, the lower end portions of the first signal terminals 120l to 120v include the inclined surface S11 facing the rearward-downward direction and the inclined surface S12 facing the forward-downward direction. In addition, the lower end portions of the first signal terminals 120a to 120v may be bent in a U-shape when viewed in the rightward-leftward direction. Even in this case, the lower end portions of the first signal terminals 120l to 120v include the inclined surface S11 facing the rearward-downward direction and the inclined surface S12 facing the forward-downward direction.

When the inspection connector 100d is not attached to the mating connector 500, portions other than the lower end portions of the first signal terminals 120a to 120v extend in the upward-downward direction. However, the signal terminal holding member 110 may come into contact with the portions other than the lower end portions of the first signal terminals 120a to 120k from behind. In this manner, the portions other than the lower end portions of the first signal terminals 120a to 120k may be bent in the forward direction. Similarly, the signal terminal holding member 110 may come into contact with the portions other than the lower end portions of the first signal terminals 120l to 120v from the front. In this manner, the portions other than the lower end portions of the first signal terminals 120l to 120v may be bent in the rearward direction. The plunger lower portion 102a may come into contact with the mating connector 500 so that the first signal terminals 120a to 120v are positioned with respect to the second signal terminals 520a to 520v. In this manner, the first signal terminals 120a to 120v may be bent as described above. In addition, since the first signal terminals 120a to 120v are bent, when the inspection connector 100d is attached to the mating connector 500, the first signal terminals 120a to 120v can come into pressure-contact with the second signal terminals 520a to 520v with a sufficient force.

Next, a structure of the housing 104 will be described with reference to the drawings. The housing 104 has a cylindrical shape. However, as illustrated in FIG. 24, the diameter of the inner peripheral surface of the housing 104 is smaller than the width of the circuit substrate 112 in the rightward-leftward direction. Therefore, the housing 104 is provided with grooves SL10 and SL11. The groove SL10 is recessed in the leftward direction from the left end of the inner peripheral surface of the housing 104. The groove SL11 is recessed in the rightward direction from the right end of the inner peripheral surface of the housing 104. The grooves SL10 and SL11 extend in the upward-downward direction. The circuit substrate 112 is inserted into the groove SL10. In this manner, the circuit substrate 112 is held by the housing 104. As a result, a possibility that the circuit substrate 112 slides in the forward-rearward direction and a possibility that the circuit substrate 112 rotates around a rotation axis line extending in the upward-downward direction are suppressed.

Other Embodiments

The inspection connector according to the present disclosure is not limited to the inspection connectors 100 and 100a to 100d according to the above-described embodiments, and can be modified within the scope of the concept of the present disclosure.

In addition, configuration elements of the inspection connectors 100 and 100a to 100d may be combined in any desired way.

The cylindrical member 101 does not need to have conductivity. That is, the cylindrical member 101 may have insulating properties. In this case, a material of the cylindrical member 101 is a resin, for example.

The mating connector 500 may include one or more second signal terminals.

The number of the coaxial cables may be one or more.

The inspection connectors 100 and 100a to 100d may include one or more first signal terminals.

The circuit substrate 112 may include one or more signal wires.

The circuit substrate 112 does not need to include the ground wire. In addition, the circuit substrate 112 may include one or more ground wires.

The inspection connectors 100 and 100a to 100d may include the insulating member having the same shape as that of the ground member instead of the ground member.

In the inspection connector 100a, the first signal terminal to which the fourth end portions ta2 and the ta22 are electrically connected and the first signal terminal to which the second end portion Ta2 is electrically connected do not need to be adjacent to each other. The first signal terminal to which the fourth end portions ta22 and tb2 are electrically connected and the first signal terminal to which the second end portion Tb2 is electrically connected do not need to be adjacent to each other.

In the inspection connectors 100 and 100a to 100d, the circuit substrate 112 may be detachably held by the signal terminal holding member 110 in such a manner that a portion of the circuit substrate 112 is hooked on the signal terminal holding member 110.

In the inspection connectors 100 and 100a to 100d, since the upper end of the circuit substrate 112 is located above the upper end of the cylindrical member 101, a portion of the circuit substrate 112 is visually recognized when viewed in the direction orthogonal to the upward-downward direction. Therefore, in the inspection connectors 100 and 100a to 100d, the coaxial cables 400a to 400d may extend in the rightward direction or in the leftward direction from the external connecting connectors 200a and 200b. In this way, the extending direction of the coaxial cables 400a to 400d can be designed in any desired way. As a result, it is no longer necessary to unnecessarily bend the coaxial cables 400a to 400d.

The third end portion ta1 may be electrically connected to the plurality of outer conductors. The third end portion tb1 may be electrically connected to the plurality of outer conductors.

The number of the fourth end portions may be one or more.

The number of the recessed portions may be one or more.

The recessed portion ga has the upper surface, the lower surface, and the right surface, as illustrated in FIG. 7. The right surface is a surface facing the leftward direction. The fourth end portion ta2 is located on the lower surface of the recessed portion ga. However, the fourth end portion ta may be located on the right surface of the recessed portion ga, or may be located on the upper surface. In addition, as illustrated in FIG. 7, the recessed portion gb has the upper surface, the lower surface, and the left surface. The left surface is a surface facing the rightward direction. The fourth end portion tb2 is located on the lower surface of the recessed portion gb. However, the fourth end portion tb may be located on the left surface of the recessed portion gb, or may be located on the upper surface.

What is claimed is:

1. An inspection connector connected to an end portion of one or more coaxial cables including a central conductor, an outer conductor for surrounding a periphery of the central conductor, an insulator for insulating the central conductor and the outer conductor from each other, and a coating for surrounding a periphery of the outer conductor, and configured for inspecting an electronic device including a mating connector including one or more second signal terminals, the inspection connector comprising:

a cylindrical member having a cylindrical shape having a central axis line extending in an upward-downward direction;

a signal terminal holding member inside the cylindrical member in a lower portion of the cylindrical member and held by the cylindrical member;

one or more first signal terminals supported by the signal terminal holding member and electrically connected to any one of the one or more second signal terminals; and a circuit substrate held by the signal terminal holding member, wherein the circuit substrate includes a substrate main body and one or more signal wires, the substrate main body has a plate shape having two main surfaces aligned in a forward-rearward direction, each of the one or more signal wires includes a first end portion in an upper portion of the substrate main body and a second end portion in a lower portion of the substrate main body, each of the one or more first end portions is electrically connected to any one of the one or more central conductors, each of the one or more second end portions is electrically connected to any one of the one or more first signal terminals, and an upper end of the circuit substrate is above an upper end of the cylindrical member so that a portion of the circuit substrate is visually recognized, when viewed in a direction orthogonal to the upward-downward direction.

2. The inspection connector according to claim 1, wherein the cylindrical member has conductivity.

3. The inspection connector according to claim 2, wherein the mating connector further includes a ground conductor connected to a ground potential, and the cylindrical member is electrically connected to the ground conductor.

4. The inspection connector according to claim 2, wherein the circuit substrate includes one or more ground wires having a third end portion in an upper portion of the circuit substrate and a fourth end portion in a lower portion of the circuit substrate, each of the one or more third end portions is electrically connected to any one of the one or more outer conductors, a number of the one or more first signal terminals is plural, the plurality of first signal terminals are aligned in a first row extending in a rightward-leftward direction and a second row in front of the first row and extending in the rightward-leftward direction, the signal terminal holding member further includes a ground member electrically connected to the one or more fourth end portions and being between the first row and the second row, and the ground member is in contact with the cylindrical member.

5. The inspection connector according to claim 4, wherein the circuit substrate further includes a metal member fixed to a lower end portion of the substrate main body and electrically connected to the one or more fourth end portions, and a portion of the signal terminal holding member is hooked on the metal member so that the circuit substrate is detachably held by the signal terminal holding member.

6. The inspection connector according to claim 4, wherein the substrate main body has one or more recessed portions, the one or more fourth end portions are in the one or more recessed portions, and the ground member is hooked on the one or more recessed portions so that the ground member is in contact with the one or more fourth end portions.

7. The inspection connector according to claim 1, wherein the circuit substrate includes one or more ground wires having a third end portion in the upper portion of the substrate main body and a fourth end portion in the lower portion of the substrate main body, each of the one or more third end portions is electrically connected to any one or more of the one or more outer conductors, and each of the one or more fourth end portions is electrically connected to any one of the one or more first signal terminals.

8. The inspection connector according to claim 7, wherein the first signal terminal to which the fourth end portion is electrically connected and the first signal terminal to which the second end portion is electrically connected are adjacent to each other.

9. The inspection connector according to claim 1, wherein the signal terminal holding member includes a groove open in an upward direction and extending in a rightward-leftward direction, and a lower end portion of the circuit substrate is inserted into the groove.

10. The inspection connector according to claim 9, wherein an inner peripheral surface of the groove includes a front surface and a rear surface which face each other, an upper end portion of the front surface has a normal line extending in a rearward-upward direction, and an upper end portion of the rear surface has a normal line extending in a forward-upward direction.

11. The inspection connector according to claim 1, wherein an inner peripheral surface of the cylindrical member has a circular shape when viewed in the upward-downward direction, and a length of the substrate main body in a rightward-leftward direction is substantially equal to a diameter of the inner peripheral surface of the cylindrical member.

12. The inspection connector according to claim 1, wherein a width of a lower end portion of the circuit substrate in a rightward-leftward direction coincides with a maximum value of a width of the circuit substrate in the rightward-leftward direction.

13. The inspection connector according to claim 1, further comprising:

a holding member fixed to the circuit substrate on the circuit substrate, wherein an upper end of the holding member is above the upper end of the cylindrical member so that a portion of the holding member is visually recognized, when viewed in a direction orthogonal to the upward-downward direction.

14. An inspection connector connected to an end portion of one or more coaxial cables including a central conductor, an outer conductor for surrounding a periphery of the central conductor, an insulator for insulating the central conductor and the outer conductor from each other, and a coating for surrounding a periphery of the outer conductor, and configured for inspecting an electronic device including a mating connector including one or more second signal terminals, the inspection connector comprising:

a cylindrical member having a cylindrical shape having a central axis line extending in an upward-downward direction;

a signal terminal holding member inside the cylindrical member in a lower portion of the cylindrical member and held by the cylindrical member;

one or more first signal terminals supported by the signal terminal holding member and electrically connected to any one of the one or more second signal terminals; and a circuit substrate held by the signal terminal holding member, wherein the circuit substrate includes a substrate main body and one or more signal wires, the substrate main body has a plate shape having two main surfaces aligned in a forward-rearward direction, each of the one or more signal wires includes a first end portion in an upper portion of the substrate main body and a second end portion in a lower portion of the substrate main body, each of the one or more first end portions is electrically connected to any one of the one or more central conductors, each of the one or more second end portions is electrically connected to any one of the one or more first signal terminals, and a portion of the circuit substrate is hooked on the signal terminal holding member or a portion of the signal terminal holding member is hooked on the circuit substrate so that the circuit substrate is detachably held by the signal terminal holding member.

15. The inspection connector according to claim 14, wherein the cylindrical member has conductivity.

16. The inspection connector according to claim 14, wherein the circuit substrate includes one or more ground wires having a third end portion in the upper portion of the substrate main body and a fourth end portion in the lower portion of the substrate main body, each of the one or more third end portions is electrically connected to any one or more of the one or more outer conductors, and each of the one or more fourth end portions is electrically connected to any one of the one or more first signal terminals.

17. The inspection connector according to claim 14, wherein the signal terminal holding member includes a groove open in an upward direction and extending in a rightward-leftward direction, and a lower end portion of the circuit substrate is inserted into the groove.

18. The inspection connector according to claim 14, wherein an inner peripheral surface of the cylindrical member has a circular shape when viewed in the upward-downward direction, and a length of the substrate main body in a rightward-leftward direction is substantially equal to a diameter of the inner peripheral surface of the cylindrical member.

19. The inspection connector according to claim 14, wherein a width of a lower end portion of the circuit substrate in a rightward-leftward direction coincides with a maximum value of a width of the circuit substrate in the rightward-leftward direction.

20. The inspection connector according to claim 14, further comprising:

a holding member fixed to the circuit substrate on the circuit substrate, wherein an upper end of the holding member is above the upper end of the cylindrical member so that a portion of the holding member is visually recognized, when viewed in a direction orthogonal to the upward-downward direction.

\* \* \* \* \*